(12) United States Patent
Wu et al.

(10) Patent No.: US 9,994,956 B2
(45) Date of Patent: Jun. 12, 2018

(54) APPARATUS FOR IN SITU DEPOSITION OF MULTILAYER STRUCTURES VIA ATOMIC LAYER DEPOSITION AND ULTRA-HIGH VACUUM PHYSICAL OR CHEMICAL VAPOR DEPOSITION

(71) Applicants: Judy Z. Wu, Lawrence, KS (US); Rongtao Lu, Lawrence, KS (US); Alan Elliot, Lee's Summit, MO (US); Allen Hase, Lawrence, KS (US)

(72) Inventors: Judy Z. Wu, Lawrence, KS (US); Rongtao Lu, Lawrence, KS (US); Alan Elliot, Lee's Summit, MO (US); Allen Hase, Lawrence, KS (US)

(73) Assignee: University of Kansas, Lawerence, KS (US)

( * ) Notice: Subject to any disclaimer, the term of this patent is extended or adjusted under 35 U.S.C. 154(b) by 810 days.

(21) Appl. No.: 14/456,397

(22) Filed: Aug. 11, 2014

(65) Prior Publication Data
US 2016/0040288 A1 Feb. 11, 2016

(51) Int. Cl.
*C23C 16/455* (2006.01)
*C23C 16/46* (2006.01)
(Continued)

(52) U.S. Cl.
CPC ...... *C23C 16/45544* (2013.01); *C23C 14/566* (2013.01); *C23C 16/4401* (2013.01);
(Continued)

(58) Field of Classification Search
CPC .............................. C23C 14/566; C23C 16/54
See application file for complete search history.

(56) References Cited

U.S. PATENT DOCUMENTS

| 4,542,712 A * | 9/1985 | Sato ........................ C30B 23/02 |
| | | 118/500 |
| 6,183,564 B1 | 2/2001 | Reynolds et al. |

(Continued)

OTHER PUBLICATIONS

Elliot et al., Integrating atomic layer deposition and ultra-high vacuum physical vapor deposition for in situ fabrication of tunnel junctions, Rev. Sci. Instrum., vol. 85, No. 7, doi: 10.1063/1.4890286, Jul. 2014.
(Continued)

*Primary Examiner* — Parviz Hassanzadeh
*Assistant Examiner* — Nathan K Ford
(74) *Attorney, Agent, or Firm* — Bell & Manning, LLC

(57) ABSTRACT

An apparatus for in situ fabrication of multilayer heterostructures is provided comprising a first vacuum chamber adapted for atomic layer deposition and comprising a first stage docking assembly configured to dock a detachable stage configured to support a substrate; a second vacuum chamber adapted for ultra-high vacuum physical or chemical vapor deposition and comprising a second stage docking assembly configured to dock the detachable stage; a load lock vacuum chamber between the first and second vacuum chambers and comprising a third stage docking assembly configured to dock the detachable stage, the load lock vacuum chamber coupled to the first vacuum chamber via a first shared valve and coupled to the second vacuum chamber via a second shared valve; and a substrate transport vacuum chamber comprising a substrate transfer device, the substrate transfer device configured to detachably couple to the detachable stage and to transfer the substrate supported by the detachable stage in situ between the first vacuum chamber, the second vacuum chamber and the load lock vacuum chamber.

12 Claims, 21 Drawing Sheets

(51) Int. Cl.
*H01L 21/67* (2006.01)
*C23C 14/56* (2006.01)
*C23C 16/44* (2006.01)
*C23C 16/54* (2006.01)

(52) U.S. Cl.
CPC .............. *C23C 16/46* (2013.01); *C23C 16/54* (2013.01); *H01L 21/67173* (2013.01)

(56) References Cited

U.S. PATENT DOCUMENTS

| | | | |
|---|---|---|---|
| 6,206,969 B1* | 3/2001 | Takahashi | C23C 14/564 118/50 |
| 6,617,173 B1 | 9/2003 | Sneh | |
| 6,740,585 B2 | 5/2004 | Yoon et al. | |
| 7,618,893 B2 | 11/2009 | Fu et al. | |
| 2009/0214785 A1* | 8/2009 | Arena | C23C 16/303 427/255.28 |
| 2011/0308453 A1* | 12/2011 | Su | C23C 16/303 118/708 |
| 2012/0196030 A1* | 8/2012 | Neal | C23C 14/02 427/8 |
| 2013/0196078 A1 | 8/2013 | Yudovsky et al. | |
| 2014/0053779 A1 | 2/2014 | Martinson et al. | |

OTHER PUBLICATIONS

Elliot et al., Probing the Nucleation of $Al_2O_3$ in Atomic Layer Deposition on Aluminum for Ultrathin Tunneling Barriers in Josephson Junctions, IEEE Transactions on Applied Superconductivity, vol. 23, No. 3, Feb. 14, 2013.

Lu et al., Fabrication of $Nb/Al_2O_3/Nb$ Josephson Junctions Using in situ Magnetron Sputtering and Atomic Layer Deposition, IEEE Trans. Appl. Supercond., vol. 23, No. 3, doi: 10.1109/TASC.2012.2236591, arXiv:1309.4410v1, Jun. 2013.

* cited by examiner

○ Oxygen

● Aluminum

APPARATUS FOR IN SITU DEPOSITION OF MULTILAYER STRUCTURES VIA ATOMIC LAYER DEPOSITION AND ULTRA-HIGH VACUUM PHYSICAL OR CHEMICAL VAPOR DEPOSITION

REFERENCE TO GOVERNMENT RIGHTS

This invention was made with government support under W911NF-09-1-0295 and W911NF-12-1-0412 awarded by the Army Research Office; under H94003-04-D-0004-0149 awarded by the Defense Microelectronics Activity; and under 0803149, 1105986 and 0903806 awarded by the National Science Foundation. The government has certain rights in the invention.

BACKGROUND

Many technologies rely on ultrathin dielectric layers to act as tunnel barriers between two electrodes to form metal-insulator-metal (MIM) structures. For example, magnetic tunnel junctions (MTJs), which have contributed to the rapid miniaturization of computer memories, are simply two metallic ferromagnetic thin film electrodes with a ~0.1 nm-2 nm dielectric layer between them. The figure-of-merit tunnel magnetoresistance (TMR), defined as the ratio of the resistance of the device when the ferromagnetic layers are magnetized in parallel and anti-parallel directions, depends critically on the thickness of the dielectric layer. The TMR oscillates with the thickness of the dielectric layer with a period of only ~0.3 nm, so subnanometer thickness control of ultrathin films is necessary. Another example is the Josephson junction (JJ), a superconductor-insulator-superconductor (SIS) device used in voltage standards, superconducting quantum interference devices (SQUIDs), and quantum bits (qubits). A leak-free tunnel barrier with thickness much smaller than the superconducting coherence length is typically required for the superconductor electrodes to remain phase coherent. Further, because the critical current through the JJ decays exponentially with increasing tunnel barrier thickness, in Nb—Al/AlOx/Nb JJs the AlOx tunnel barrier thickness is typically on the order of 1 nm. (See L. A. Abelson and G. L. Kerber, Proceedings of the IEEE 92 (10), 1517 (2004).)

Producing an ultrathin, uniform, and leak-free dielectric film is difficult on metal substrates due to the naturally formed native oxides on most metals such as Nb. Nb—Al/AlOx/Nb JJs are an excellent example. Techniques which have been used include thermal oxidation schemes, Molecular Beam Epitaxy (MBE) and Chemical Vapor Deposition (CVD). However, these techniques suffer from a number of drawbacks such as numerous defects in the dielectric film, excessive complexity/cost, insufficiently thin dielectric films, and/or dielectric films with non-uniform thicknesses.

Atomic Layer Deposition (ALD) is also a chemical process like CVD, but it differs from CVD in terms of its self-limiting growth mechanism, which allows thickness precision at the atomic scale. ALD produces atomic layer-by-layer growth via sequential exposure of relevant chemical sources following well-defined chemical reactions. Taking $Al_2O_3$ as an example, alternating pulses of $H_2O$ and trimethylaluminum (TMA) are exposed to heated substrates, separated by a flush of inert carrier gas to assure the two chemicals never meet in a gaseous state. Growth of $Al_2O_3$ occurs via ligand exchange between $H_2O$ and TMA at the sample surface and is described by the chemical reactions

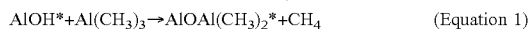

(Equation 1)

(Equation 2)

where an asterisk denotes a surface species. There are several unique merits associated with the ALD process. First, ALD is a relatively low temperature process with ALD $Al_2O_3$ typically occurring near 200° C. This low thermal budget is particularly important to monolithic devices on Si-readout circuits. Another merit is that the involved chemical reactions occur only on the sample's surface, and the reactions stop at the completion of each exposure. ALD growth is hence self-limiting. In each cycle of ALD $Al_2O_3$, i.e. after both the reactions shown in Equations (1) and (2) have occurred once, only one molecular layer is produced, or about 1.2 Å thickness of $Al_2O_3$. This provides atomic-scale control of film thickness. Finally, ALD coatings are highly conformal, which is particularly important to coating surfaces with large aspect ratios. A large variety of films, including metals and dielectrics, can be grown using ALD as long as the sources for the relevant chemical reactions are available.

The quality of ultrathin films depends critically on their nucleation on substrates (or "M" electrode in MIM structures), which means substrate surface preparation is a key towards achieving leak-free tunnel barriers using ALD. The chemical reactions in an ALD process (for example, ALD $Al_2O_3$ given in Eqns. 1-2) require the existence of surface species, particularly hydroxyl surface groups (OH*) or methyl surface groups ($CH_3$*). This requirement is automatically satisfied on certain substrates, such as $SiO_2$ since residual $H_2O$ on the surface produces a well hydroxylated surface ready for ALD nucleation. However, for substrates that are poorly hydroxylated, such as hydrogen terminated silicon (H—Si), nucleation is frustrated due to the lack of reaction sites on the surface. While the dangling hydrogen bonds on H—Si do serve as reaction sites to some degree, the initial stages of growth are dominated by the formation of a ~1 nm thick silicate interfacial layer (IL). (See Martin M. Frank, Yves J. Chabal, and Glen D. Wilk, Applied Physics Letters 82 (26), 4758 (2003).) However, surface activation, such as pre-exposing the H—Si to a large dose of TMA for ALD $Al_2O_3$ growth, has been shown to reduce the IL to ~0.5 nm for an $Al_2O_3$ film with a total thickness of ~3 nm. (Id. and see Xu Min, Lu Hong-Liang, Ding Shi-Jin, Sun Liang, Zhang Wei, and Wang Li-Kang, Chinese Physics Letters 22 (9), 2418 (2005).)

Similarly to $SiO_2$ and H—Si, metallic substrates can be classified into two categories; those with a reactive surface, such as Al and Cu, and those without, such as Au and Pt. In the former case, for ex situ deposited metals, a native oxide of several nanometers (up to ~5 nm for Al) will pre-exist, and ALD growth occurs easily on top. (See M. D. Groner, J. W. Elam, F. H. Fabreguette, and S. M. George, Thin Solid Films 413, 186 (2002) and A. J. Elliot, G. Malek, L. Wille, R. T. Lu, S. Han, J. Z. Wu, J. Talvacchio, and R. Lewis, Applied Superconductivity Conference 2012 (2012).) For in situ deposited metals, an IL may form from thermal oxidation or chemisorption of the ALD precursors, and this IL may range in thickness from ~0.4 nm on in situ ALD-W (R. K. Grubbs, C. E. Nelson, N. J. Steinmetz, and S. M. George, Thin Solid Films 467, 16 (2004)) to ~2 nm on in situ sputtered Al (A. J. Elliot, G. Malek, L. Wille, R. T. Lu, S. Han, J. Z. Wu, J. Talvacchio, and R. Lewis, Applied Superconductivity Conference 2012 (2012)). On noble metals, such as Pt, Ir, and Ru, nucleation of ALD films can be completely frustrated during the first 30-50 cycles of growth. (See K. Kukli, M. Ritala, T. Pilvi, T. Aaltonen, J. Aarik, M. Lautala, and M. Leskelä, Materials Science and Engineering B 118, 112 (2005).) These initial cycles act as an incubation process to prepare the surface for nucleation by adsorbing source material on the surface, effectively increasing its reactivity. ILs several nm thick have been reported when growing ALD dielectric films on noble metals, and they form through the diffusion of source material into the metal film, such as the diffusion of Tetrakis(ethylmethylamido)hafnium(IV) (TEMAH) into Pt during the growth of $HfO_2$. (See K. Kukli, T. Aaltonen, J. Aarik, J. Lu, M. Ritala, S. Ferrari, A. Hårsta, and M. Leskelä, Journal of the Electrochemical Society 152, F75 (2005) and C. Chang, Y. Chiou, C. Hsu, and T. Wu, Electrochemical Solid State Letters 10 (3), G5 (2007)). The exact thickness and composition of the IL depend on the substrates and sources used. But, in the case of ALD-$HfO_2$ on Pt, the IL thickness can be reduced from ~10 nm to ~5 nm and the interface can be made more uniform by exposing the metal film to a hydrous plasma to promote surface oxidation before ALD dielectric layer growth. (See C. Chang, Y. Chiou, C. Hsu, and T. Wu, Electrochemical Solid State Letters 10 (3), G5 (2007).) In either case of reactive or noble metals, the IL issue must be addressed in order to produce an ultrathin dielectric tunnel barrier using ALD on a metal substrate with minimized IL effect for tunnel junctions and many other MIM structures.

SUMMARY

Provided herein are apparatus for in situ fabrication of multilayer heterostructures using a combination of atomic layer deposition (ALD) and at least one other vacuum deposition technique, e.g., ultra-high vacuum physical or chemical vapor deposition (UHV PVD or CVD). Methods of using the apparatus are also provided.

In one aspect, an apparatus for in situ fabrication of multilayer heterostructures comprises: a first vacuum chamber adapted for atomic layer deposition and comprising a first stage docking assembly configured to dock a detachable stage configured to support a substrate; a second vacuum chamber adapted for ultra-high vacuum physical or chemical vapor deposition and comprising a second stage docking assembly configured to dock the detachable stage; a load lock vacuum chamber between the first and second vacuum chambers and comprising a third stage docking assembly configured to dock the detachable stage, the load lock vacuum chamber coupled to the first vacuum chamber via a first shared valve and coupled to the second vacuum chamber via a second shared valve; and a substrate transport vacuum chamber comprising a substrate transfer device, the substrate transfer device configured to detachably couple to the detachable stage and to transfer the substrate supported by the detachable stage in situ between the first vacuum chamber, the second vacuum chamber and the load lock vacuum chamber.

In another aspect, a method for in situ fabrication of multilayer heterostructures comprises placing a substrate supported by a detachable stage into the load lock vacuum chamber of the apparatus; moving the detachable stage via the substrate transfer device from the third stage docking assembly in the load lock vacuum chamber to the second stage docking assembly in the second vacuum chamber in situ; depositing a layer of a first material onto the substrate using ultra-high vacuum physical vapor deposition or ultra-high chemical physical vapor deposition; moving the detachable stage via the substrate transfer device to the first stage docking assembly in the first vacuum chamber in situ; and depositing a layer of a second material onto the layer of the first material via atomic layer deposition, thereby fabricating the multilayer heterostructure.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

The square junctions were fabricated with sides of 3 μm (bottom, square), 4 μm (middle, circle), and 5 μm (top, triangle). The current densities for these junctions were identical, indicating a uniform tunneling barrier was grown. The cooper pair tunneling current, which should be seen at 0 voltage, is absent despite significant single electron tunneling. This indicates an unknown mechanism was suppressing cooper pair tunneling.

Figure 17:
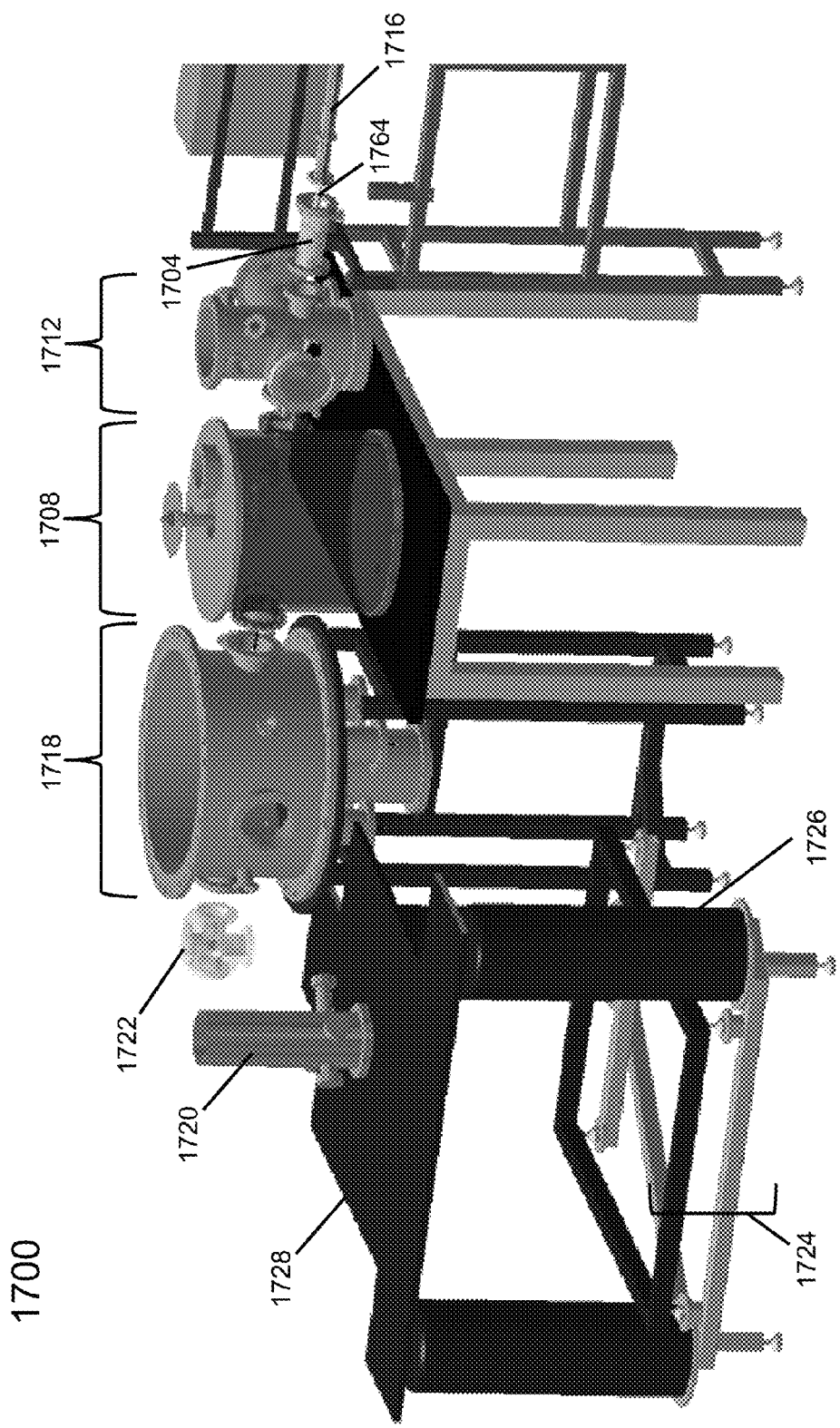

FIG. 17 shows a perspective view of an apparatus including an additional vacuum chamber adapted for another vacuum deposition technique and an additional vacuum chamber adapted for at least one in situ characterization technique for a deposited layer of the multilayer heterostructure according to an illustrative embodiment.

Figure 18:
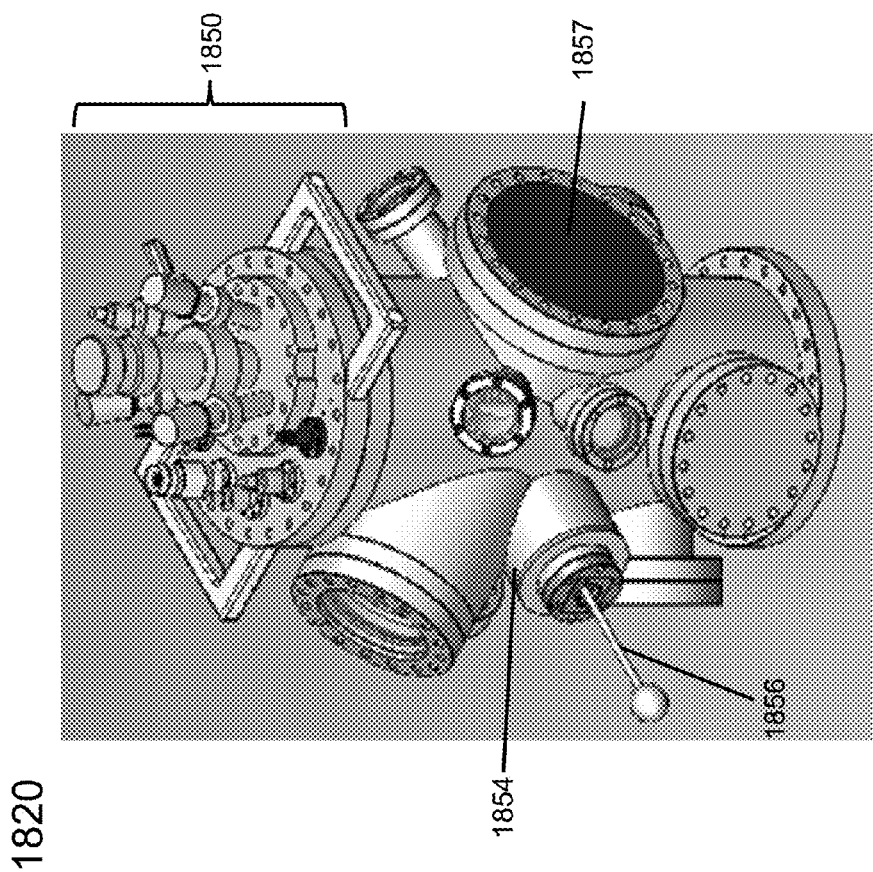

FIG. 18 shows a perspective view of an additional vacuum chamber adapted for ultra-high vacuum scanning probe microscopy-tip enhanced Raman spectroscopy (UHV SPM-TERS) for a deposited layer of the multilayer heterostructure according to an illustrative embodiment.

Figure 19:
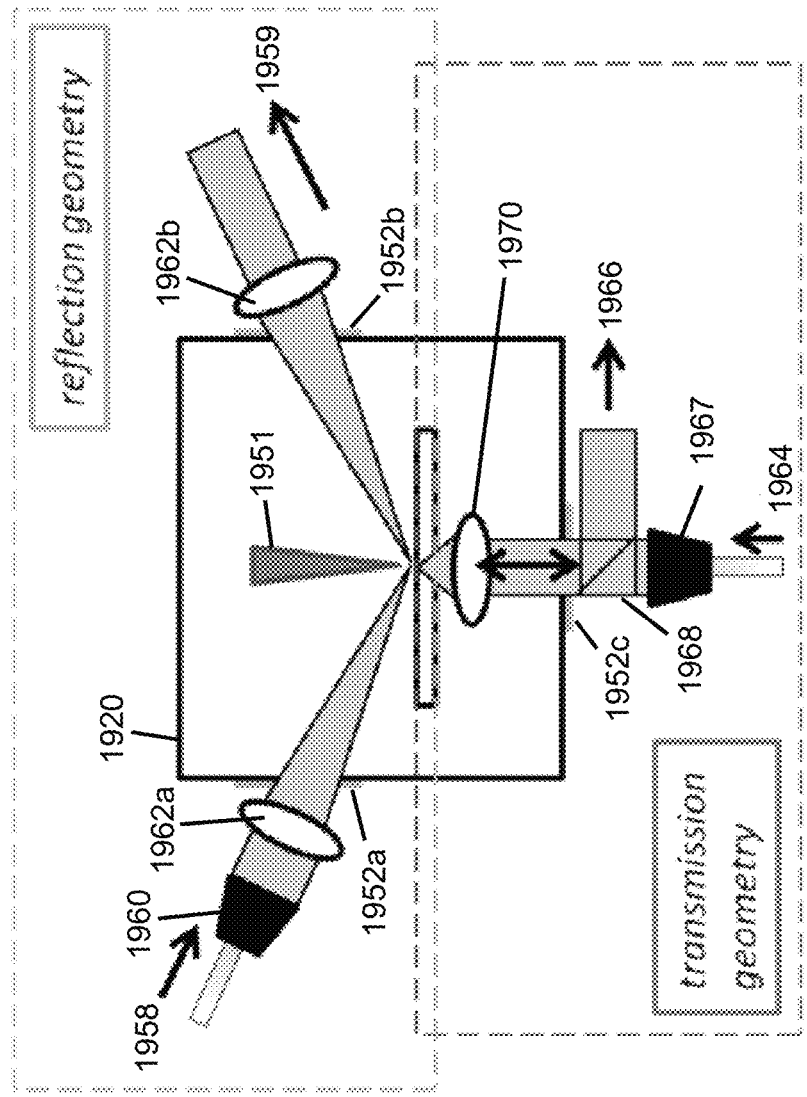

FIG. 19 depicts an optical set-up for in situ local optical excitation and spatially resolved Raman spectroscopy of deposited layers of a multilayer heterostructure using the vacuum chamber shown in FIG. 18 according to an illustrative embodiment.

Figure 20:
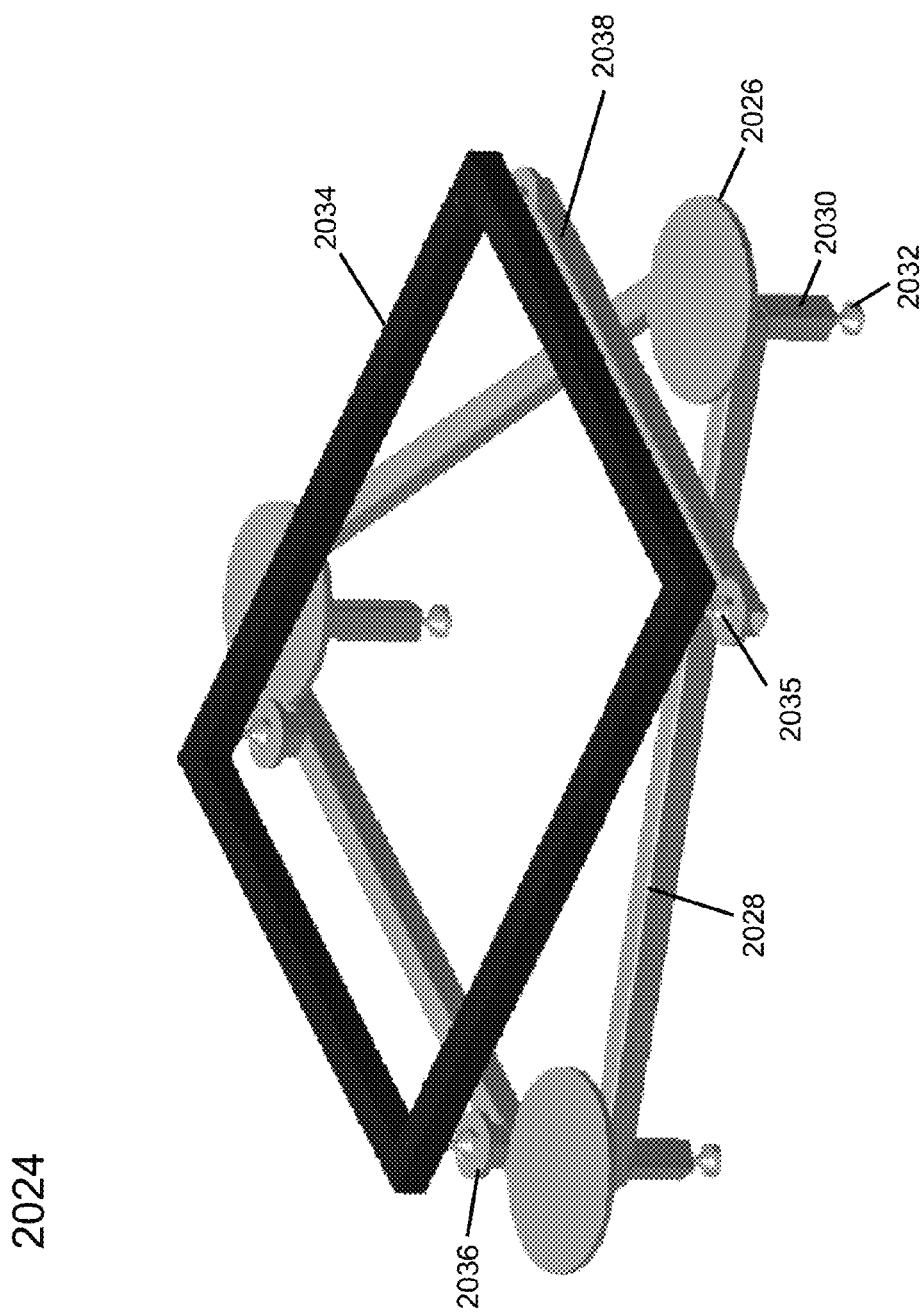

FIG. 20 shows perspective view of an adjustable height dual frame platform according to an illustrative embodiment.

Figure 21:
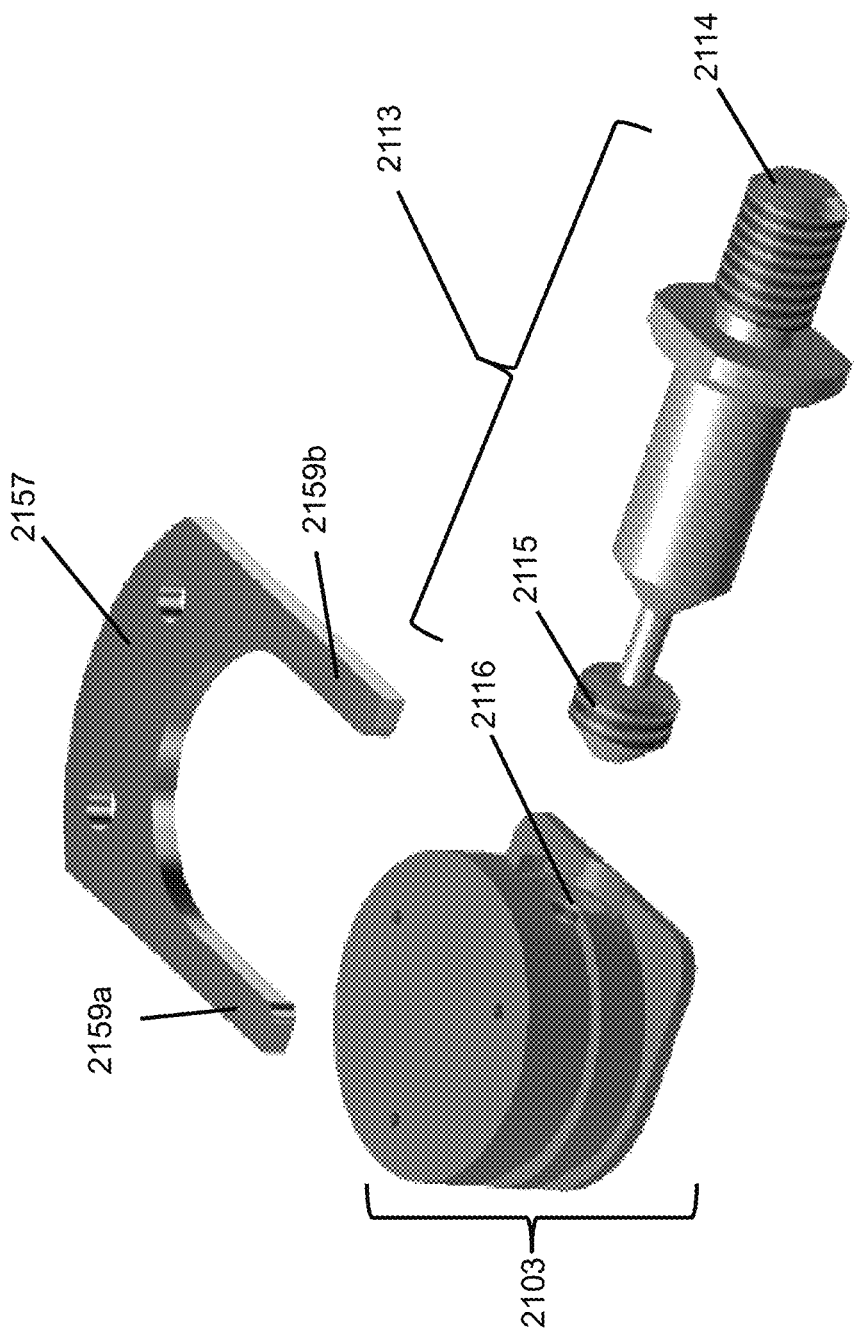

FIG. 21 shows a perspective view of a docking coupler of a detachable stage according to an illustrative embodiment.

DETAILED DESCRIPTION

Provided herein are apparatus for in situ fabrication of multilayer heterostructures using a combination of atomic layer deposition (ALD) and at least one other vacuum deposition technique, e.g., ultra-high vacuum physical or chemical vapor deposition (UHV PVD or CVD). Methods of using the apparatus are also provided.

Multilayered heterostructures that can be fabricated using the apparatus include heterostructures comprising alternating layers of different materials, e.g., metals (including ferromagnetic metals and superconducting metals) and dielectric materials. The number of layers and type of materials is not particularly limited. However, exemplary heterostructures include metal-insulator-metal (MIM) tri-layer and multilayer structures, such as Josephson junctions and magnetic tunnel junctions. Such heterostructures find applications in a variety of electronic devices, including quantum computing devices, energy storage devices and data storage devices. The present apparatus are capable of fabricating MIM heterostructures having ultrathin (e.g., 3 nm, 2 nm, 1 nm, 0.5 nm, 0.1 nm or less), uniform and leak free dielectric (i.e., insulator) layers and high-quality interfaces with surrounding metal layers.

Apparatus are able to integrate ALD with other vacuum deposition techniques having very different processing conditions, e.g., UHV PVD. The incompatibility between the processing conditions for ALD and vacuum deposition techniques such as UHV PVD is a significant challenge in designing such apparatus. For example, one difference is in the vacuum ranges required for ALD and UHV PVD. The operating pressure is typically in the range of about 10 mTorr to about 1000 mTorr for ALD and in the range of 10 nTorr to about a few mTorr for UHV PVD. Another difference is the use of chemical sources and active chemical vapors with ALD. Both differences mean that contamination of the UHV PVD chamber is a significant issue in designing an integrated apparatus. Another difference is in the sample temperatures required for ALD and UHV PVD. Taking Nb/Al/Al$_2$O$_3$/Nb SIS JJs as an example, the UHV magnetron sputtering of the Nb electrodes is carried out at temperatures below room temperature whereas the ALD deposition of Al$_2$O$_3$ occurs at the much higher temperature of 200° C. The design of the present apparatus addresses these challenges and allows the benefits of the different vacuum deposition techniques to be realized without requiring removal of the growth substrate from the apparatus during fabrication (i.e., in situ), thereby minimizing the formation of native oxides or other interfacial layers upon exposure to air. Moreover, the design is significantly more streamlined and less costly as compared to existing cluster apparatus which require numerous processing and transfer chambers and/or robotic sample transfer mechanisms.

In a basic embodiment, an apparatus for in situ fabrication of multilayer heterostructures on a substrate comprises a first vacuum chamber adapted for atomic layer deposition (ALD) and comprising a first stage docking assembly configured to dock a detachable stage configured to support the substrate; a second vacuum chamber adapted for a vacuum deposition technique other than ALD, e.g., ultra-high vacuum physical or chemical vapor deposition (UHV PVD or CVD) and comprising a second stage docking assembly configured to dock the detachable stage; a load lock vacuum chamber between the first and second vacuum chambers and comprising a third stage docking assembly configured to dock the detachable stage; and a substrate transport vacuum chamber comprising a substrate transfer device, the substrate transfer device configured to detachably couple to the detachable stage and to transfer the substrate supported by the detachable stage in situ between the first vacuum chamber, the second vacuum chamber and the load lock vacuum chamber.

Figure 1:
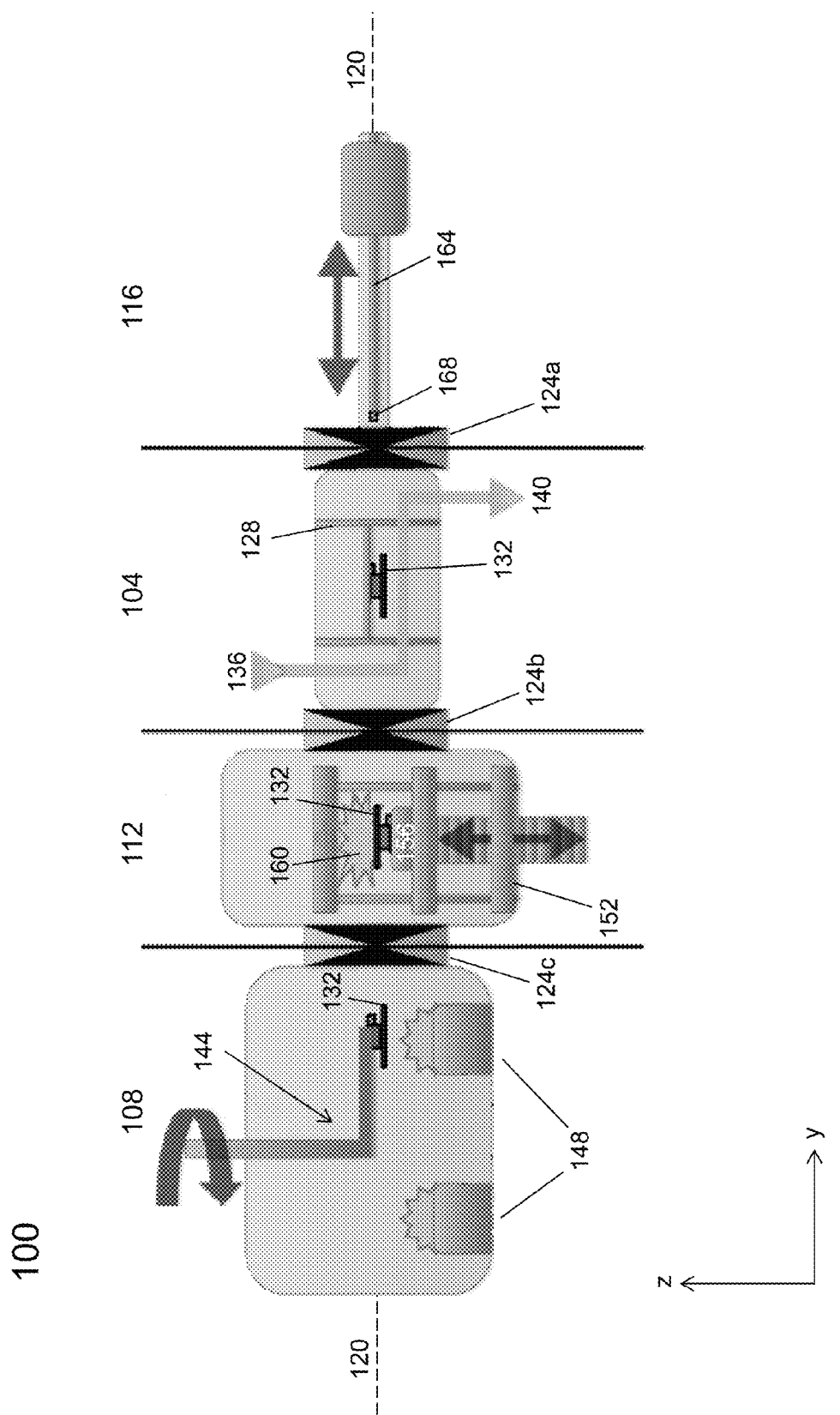
FIG. 1 shows a cross-sectional view of a schematic of an apparatus according to an illustrative embodiment.

A cross-sectional view of a schematic of an apparatus according to an illustrative embodiment is shown in FIG. 1. The apparatus 100 includes four vacuum chambers, a first vacuum chamber 104 adapted for ALD, a second vacuum chamber 108 adapted for UHV PVD, a load lock vacuum chamber 112 and a substrate transport vacuum chamber 116. The four vacuum chambers 104-116 are connected in series and are arranged collinearly such that an axis 120 runs substantially through the central portion of each vacuum chamber. Adjacent vacuum chambers are coupled via flanged gate valves 124a-c. However, any type of valve capable of isolating adjacent vacuum chambers from one another such that the desired base pressure (vacuum) or operating pressure in each chamber may be maintained may be used. The flanged gate valve 124a is shared by the first vacuum chamber 104 and the substrate transport vacuum chamber 116. By shared it is meant that opening the gate valve results in the exposure of the atmosphere in the interior of one vacuum chamber to the atmosphere in the interior of the other vacuum chamber (and closing the gate valve results in the isolation of the chambers from each other). Similarly, the flanged gate valve 124b is shared by the first vacuum chamber 104 and the load lock vacuum chamber 112 and the flanged gate valve 124c is shared by the load lock vacuum chamber 112 and the second vacuum chamber 108. Although the substrate transport vacuum chamber 116 is adjacent to the first vacuum chamber 104 and is coupled to the first vacuum chamber 104 via the flanged gate valve 124a, alternatively, the substrate transport vacuum chamber 116 may be adjacent to the second vacuum chamber 108 and coupled to it via another flanged gate valve.

Each of the vacuum chambers is capable of maintaining a desired base pressure (vacuum). For example, the first vacuum chamber adapted for ALD is capable of maintaining a base pressure of about $5\times10^{-6}$ Torr or lower. The second vacuum chamber adapted for UHV PVD or CVD is an ultra-high vacuum chamber capable of maintaining a base pressure of about $10^{-8}$ Torr or lower. The load lock vacuum chamber is capable of maintaining a base pressure of about $10^{-6}$ Torr or lower. The substrate transport vacuum chamber is capable of maintaining a base pressure of about $5\times10^{-6}$ Torr or lower. Although not shown in FIG. 1, vacuum chambers may be connected to a vacuum pump or vacuum pumping system through one or more pumping ports in chamber walls for evacuating each chamber to the desired base pressure. For example, the first vacuum chamber 104 may be connected to a mechanical pump, the second vacuum chamber 108 may be connected to a cryopump and the load lock vacuum chamber 112 may be connected to turbomolecular pump backed by a mechanical pump and an ion pump. The substrate transport vacuum chamber may be connected to either of the pumps or pumping systems of the first vacuum chamber 104 or the load lock vacuum chamber 112 through the shared flanged gate valves 124a and 124b. Different pumps and pumping systems may be used.

The first vacuum chamber 104 includes a first stage docking assembly 128 configured to dock a detachable stage 132 which is configured to support a substrate on which the multilayer heterostructure is to be fabricated. Also shown is a gas inlet port 136 in the chamber wall through which the gases necessary for carrying out ALD flow into the first vacuum chamber 104 and an exhaust port 140 through which the chamber may be evacuated.

The second vacuum chamber 108 includes a second stage docking assembly 144 configured to dock the detachable stage 132. The second vacuum chamber 108 is adapted for UHV PVD. As such, the second vacuum chamber 108 includes one or more sputtering sources 148 mounted in the chamber. The second stage docking assembly 144 is rotatable such that the substrate mounted on the detachable stage 132 can be rotated into position above the desired sputtering source. The second vacuum chamber may be modified to be adapted for UHV CVD or another vacuum deposition technique other than ALD.

The load lock vacuum chamber 112 includes a third stage docking assembly 152 configured to dock the detachable stage 132. The third stage docking assembly 152 includes a third chuck 156 configured to couple to the detachable stage 132. A linear actuator is coupled to the third chuck 156 to provide for translation in the z-direction in order to adjust the vertical position of the detachable stage 132. As further described below, the load lock vacuum chamber 112 and the third stage docking assembly 152 are adapted for in situ RF plasma treatments 160.

The substrate transport vacuum chamber 116 includes a substrate transfer device 164, e.g., linear transport rod. One end 168 is configured to detachably couple to the detachable stage 132 such that the detachable stage can be attached to and detached from the substrate transfer device 164. The linear transport rod can be translated in both directions along the axis 120 such that the substrate supported by the detachable stage 132 can be transferred in situ between the first vacuum chamber 104, the second vacuum chamber 108 and the load lock vacuum chamber 112, e.g., from the first vacuum chamber 104, through the load lock vacuum chamber 112, to the second vacuum chamber 108. In addition, the linear transport rod can be rotated about its longitudinal axis such that the substrate supported by the detachable stage 112 can be rotated to be positioned face down (as shown in the first and second vacuum chambers 104 and 108) or face up (as shown in the load lock vacuum chamber 112). The linear translation and the rotation of the linear transport rod may be accomplished manually or via motor coupled to the linear transport rod.

It is noted that the apparatus typically includes only a single detachable stage 132. The three detachable stages shown in FIG. 1 are meant to illustrate the position of the detachable stage 132 in three of the vacuum chambers.

Figure 2:
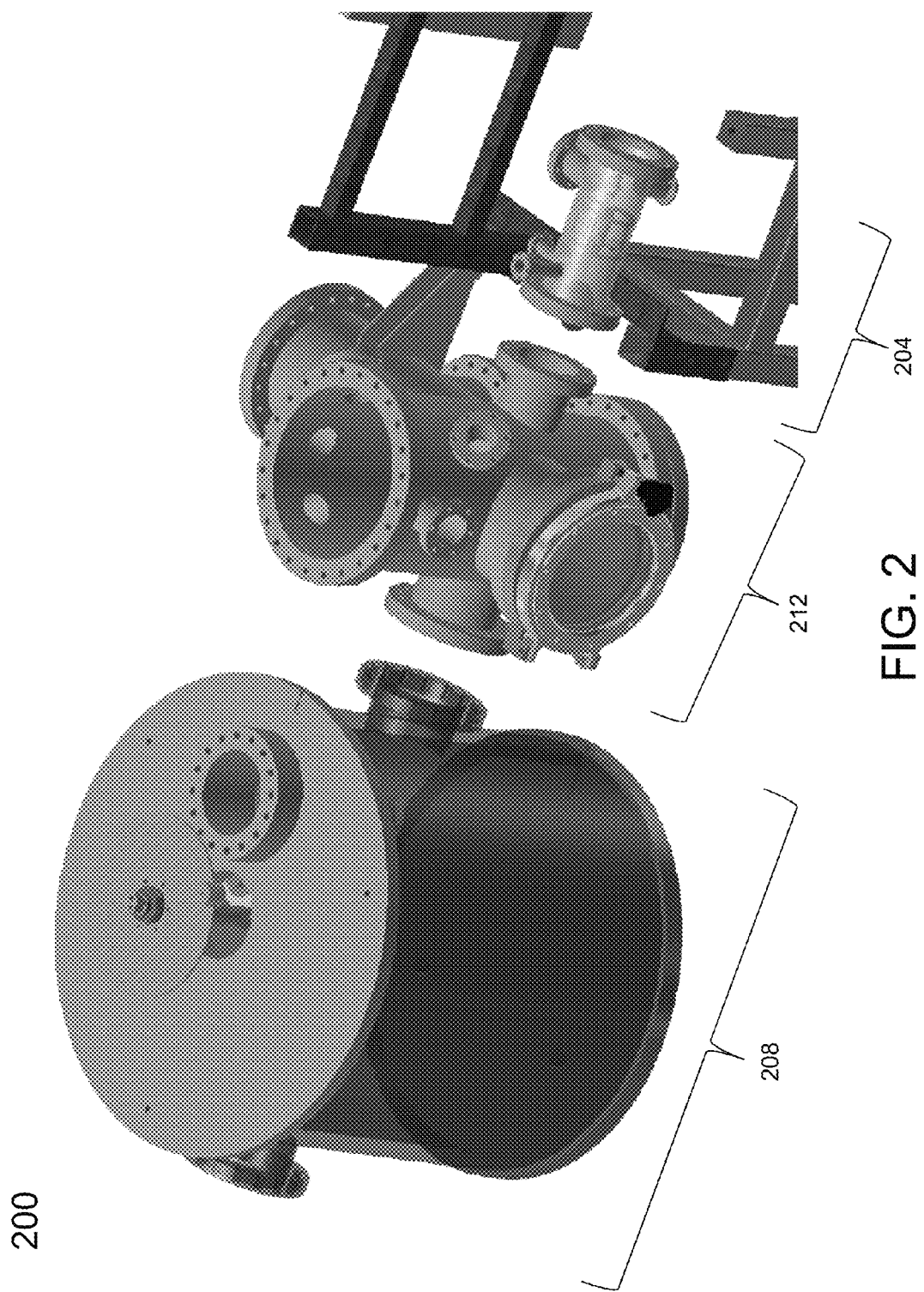
FIG. 2 shows a perspective view of an apparatus according to an illustrative embodiment.

A perspective view of another apparatus 200 according to an illustrative embodiment is shown in FIG. 2 which includes three of the four vacuum chambers, the first vacuum chamber 204 adapted for ALD, the second vacuum chamber 208 adapted for UHV PVD and a load lock vacuum chamber 212. Flanged gate valves which couple and are shared between adjacent vacuum chambers and are not shown. In addition, the substrate transport vacuum chamber, which would be coupled to the first vacuum chamber 204 via a shared flanged gate valve, is not shown due to the relatively long length of the substrate transport vacuum chamber.

Illustrative embodiments of each of the vacuum chambers and components within the chambers will be described in more detail below.

First Vacuum Chamber

As noted above, the apparatus includes a first vacuum chamber adapted for atomic layer deposition (ALD). The first vacuum chamber may be configured to provide a viscous flow reactor. Details of an illustrative embodiment of such a first vacuum chamber are provided in FIGS. 3-6.

Figure 3:
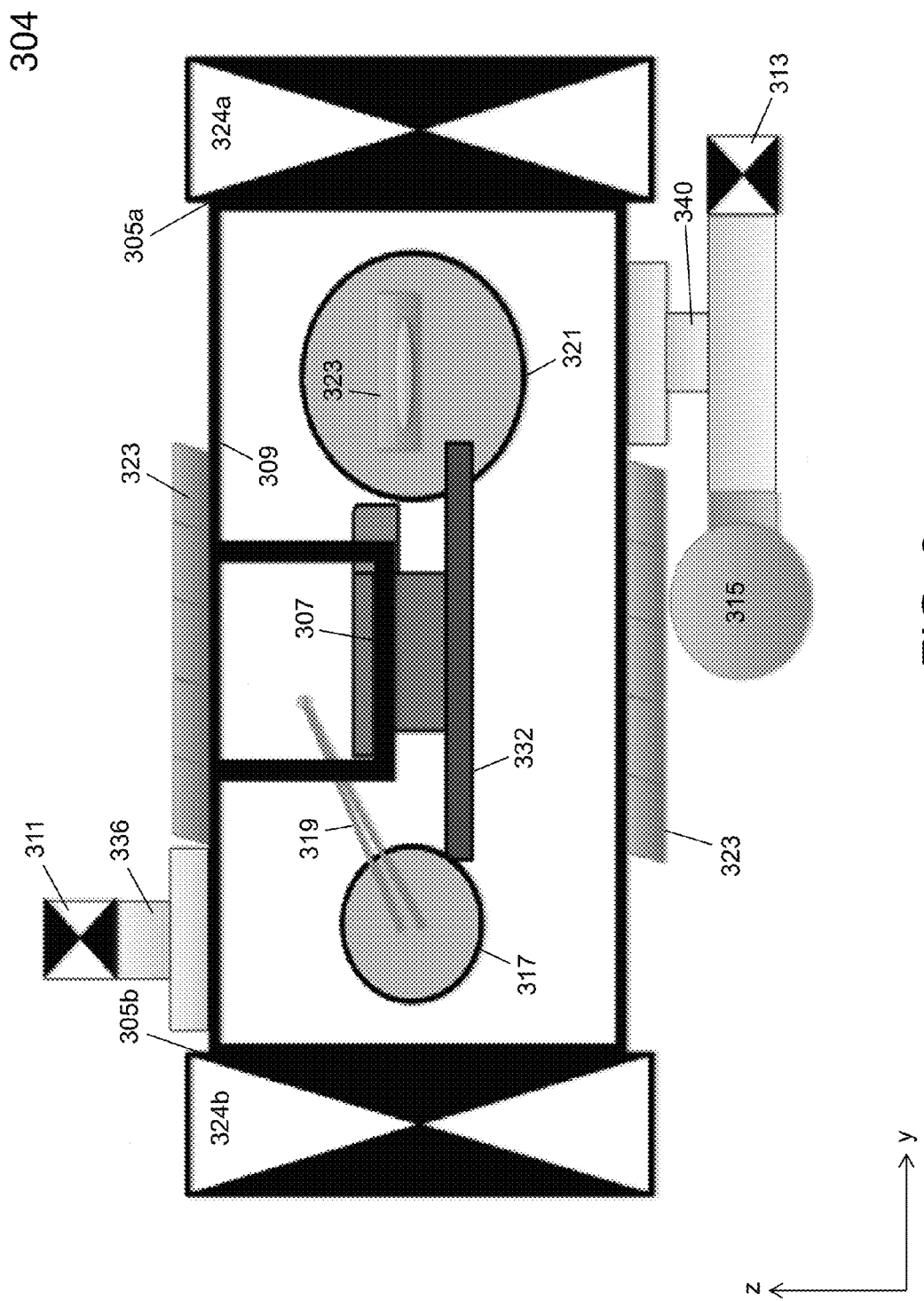
FIG. 3 shows a cross-sectional view of a schematic of a first vacuum chamber adapted for atomic layer deposition (ALD) according to an illustrative embodiment.

A cross-sectional view of a schematic of the first vacuum chamber 304 is shown in FIG. 3. The first vacuum chamber 304 is constructed from a tube (e.g., a 3 inch OD (outer diameter), 8 inch long stainless steel tube, although tubes having larger dimensions may be used) having a CF flange (e.g., 4.625 inch ID (inner diameter)) welded to each of ends 305a, b. Flanged valves 324a, b are mounted to the CF flanges. The first vacuum chamber 304 is coupled to the substrate transport vacuum chamber via the shared flanged gate valve 324a and to the load lock vacuum chamber via the shared flanged gate valve 324b. The gate valves allow the first vacuum chamber 304 to be completely isolated from the other vacuum chambers in the apparatus, allow the desired base pressure and operating pressures to be maintained within the chamber and prevent contamination of the other vacuum chambers in the apparatus with the gases used in the ALD process.

The first vacuum chamber 304 includes a first stage docking assembly, a portion of which is shown in FIG. 3, including a pair of parallel rails 307 configured to suspend a detachable stage 332 within the interior of the chamber.

The first vacuum chamber 304 is in fluid communication with a gas source manifold via a gas inlet port 336 at the top of the chamber formed from a tube (e.g., 1.33 inch ID) and CF flange and can be isolated from the manifold via a gate valve 311. The first vacuum chamber 304 is also connected to a vacuum pump or vacuum pumping system through a pumping port 340 at the bottom of the chamber formed from another tube (e.g., 1.33 inch ID) and CF flange and can be isolated from the pump(s) via a gate valve 313. A convectron pressure gauge 315 is in fluid communication with the first vacuum chamber 304 via the pumping port 340 to monitor the pressure in the chamber.

The first vacuum chamber 304 may include additional ports in chamber walls as desired. For example, a port 317 in the back side chamber wall formed from a tube (e.g., 1.33 inch ID) and CF flange can be used to mount a thermocouple 319 for monitoring the temperature of the chamber. Another port 321 in the back side chamber wall formed from a tube (e.g., a 2.75 inch ID) and CF flange can be used to mount a quartz crystal monitor (QCM) 323 for monitoring ALD growth.

Unlike conventional stand alone ALD chambers, the first vacuum chamber 304 does not include an opening (e.g., a door) through which a user can expose the chamber to atmosphere in order to manually insert a substrate into the chamber. As such, the disclosed ALD chamber minimizes exposure of the chamber to atmospheric contaminants and to oxidation of chamber surfaces.

Atomic layer deposition typically occurs at elevated temperatures, inside a chemical reaction window (i.e., "ALD window") defined by the precursor gases. The first vacuum chamber 304 may be blackbody heated (i.e., the chamber walls are heated such that the chamber walls themselves emit sufficient energy to heat the interior of the chamber and thus, components within the interior, to a desired temperature). As shown in FIG. 3, such blackbody heating may be accomplished via resistive heat tape 323 wrapped around the outer surface of the chamber walls. Power to the resistive heat tape may be provided by a variable autotransformer (e.g., a Variac) and the temperature controlled by a temperature controller (e.g., an Omega temperature controller) with feedback provided by the thermocouple 319 (e.g., a K-type thermocouple) mounted in the chamber. Blackbody heating of the ALD chamber is distinguished from heating in conventional ALD chambers in which neither the chamber walls nor chamber interior are heated, but which make use of a heater (e.g., a pancake heater) to heat a substrate via direct contact with the substrate or a support structure underlying the substrate. Blackbody heating offers a number of advantages including more uniform heating of the substrate (even relatively large substrates), reduced condensation of gas sources on the chamber walls and greater flexibility in the design of the detachable stage 132 (which is useful for the different temperature requirements in the second vacuum chamber).

Tubing connected to the first vacuum chamber for delivery of gas sources may also be blackbody heated, e.g., by resistive heat tape, to minimize condensation of the gas sources and to increase the flow of gas sources with relatively low vapor pressures (such as Tetrakis(ethylmethylamido)hafnium(IV) (TEMAH) which is used for ALD growth of $HfO_2$).

The temperatures to which the first vacuum chamber 304 and the tubing are heated depend upon the type of layer being deposited via ALD. For example, for growth of $Al_2O_3$, the first vacuum chamber may be blackbody heated to a temperature of about 200° C. and the tubing to deliver trimethylaluminum (TMA) may be blackbody heated to about 90° C. to minimize condensation without decomposing the TMA. Plots of temperature versus time for the first vacuum chamber illustrated in FIGS. 3-6 showed that such temperatures were achieved after only 90 minutes of heating at 150 W.

Other systems for heating the chamber walls and tubing may be used, although resistive heat tape offers the advantages of low cost, compatibility with a wide range of chamber geometries and dimensions, uniform heating regardless of chamber size and fast adjustments of temperature for different gas sources (due to the low thermal mass of the tubing).

Figure 4:
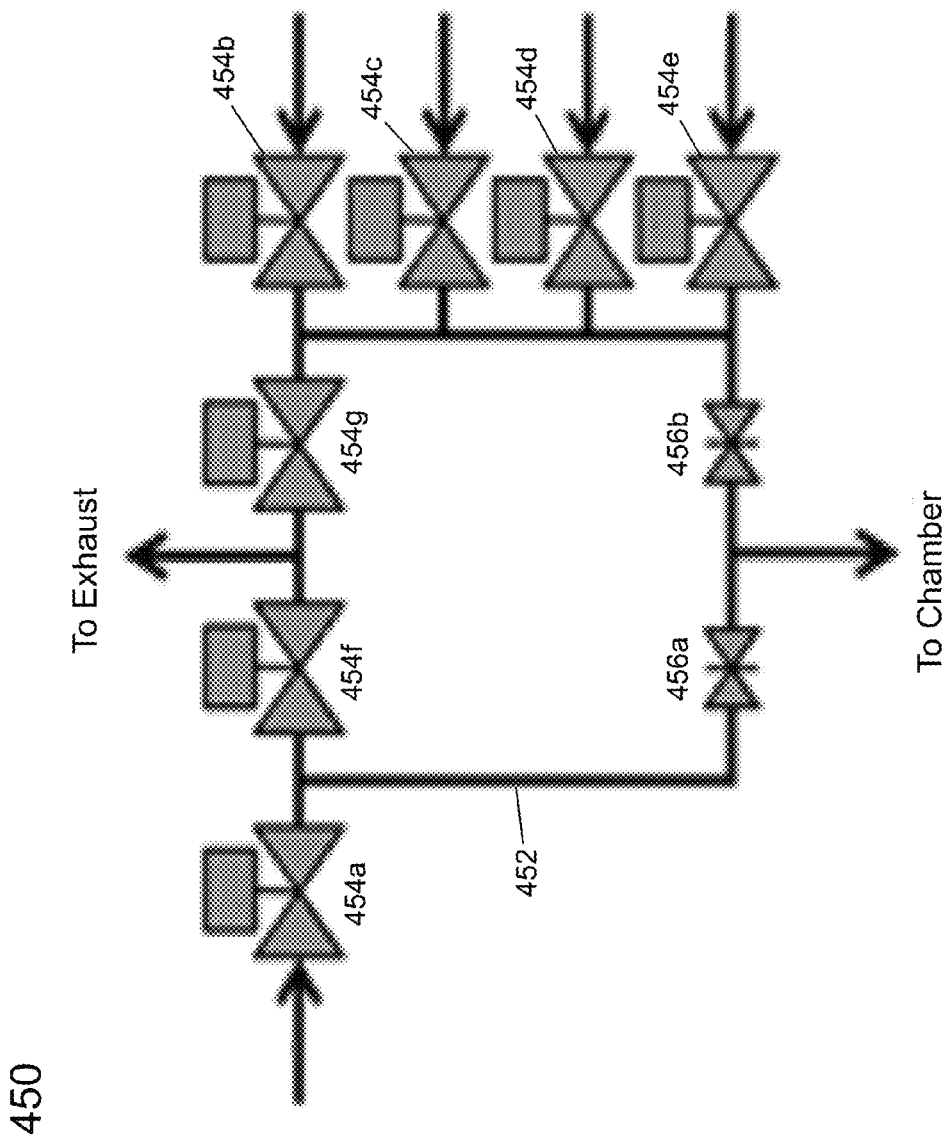
FIG. 4 shows a schematic of a gas source manifold in fluid communication with a first vacuum chamber adapted for ALD according to an illustrative embodiment.

As noted above, the first vacuum chamber 304 is in fluid communication with a gas source manifold via a gas inlet port 336. The gas source manifold is designed to deliver the gases in such a way as to achieve optimal ALD growth. A schematic of an illustrative gas source manifold 450 is shown in FIG. 4. The gas source manifold 450 includes tubing 452 (e.g., 0.25 inch OD seamless stainless steel tubing and stainless steel compression fittings by Swagelok). The gas sources enter the tubing 452 via high speed valves 454a-e (e.g., solenoid Parker Series 99 valves having a switching time of about 100 ms), which may be computer controlled by a controller and appropriate software (e.g., LabView software). Other valves may be used, e.g., diaphragm valves. The pressure pulse height of the gas sources in the first vacuum chamber is controlled by two needle valves 456a, b (e.g., by Swagelok). The number and type of gas sources is not particularly limited, but depends upon the layer to be deposited by ALD. For example, the gas sources may include $H_2O$, TMA for deposition of $Al_2O_3$, TEMAH for deposition of $HfO_2$, diethyl zinc for deposition of ZnO, and bis(ethylcyclopentadienyl)magnesium ($Mg(CpEt)_2$) for deposition of MgO. As labeled in FIG. 4, the gas source manifold 450 is connected to the first vacuum chamber (via the gas inlet port) and to the exhaust (via the exhaust port) or the pump(s) of the first vacuum chamber. Two additional high speed valves 454f, g are used to allow the gas source manifold 450 to be purged between the delivery of different gas sources. Purging is accomplished by closing the source high speed valves 454a-e and opening the exhaust high speed valves 454f, g.

An exemplary delivery sequence for the ALD growth of $Al_2O_3$ using the gas source manifold 450 of FIG. 4 is as follows. One ALD cycle consists of opening the $H_2O$ source high speed valve, opening the exhaust high speed valves 454f, g, opening the TMA source high speed valve, followed by opening the exhaust high speed valves 454f, g. Other material layers can be grown using a similar cycle, but replacing the TMA source with another source. Typically, exposure to a gas source occurs for one to five seconds and purges occur for 30 to 60 seconds, but times may be adjusted, depending upon the length of tubing in the gas source manifold.

As noted above, a quartz crystal monitor (QCM) for monitoring ALD growth may be mounted in the first vacuum chamber via one of the ports in the chamber walls. QCMs are resonating quartz crystals with a resonant frequency that decreases when mass is added to the surface of the crystal, dampening its vibration. The QCM may make use of a "RC cut" crystal (e.g., by Colnatech) instead of a standard "AT cut" crystal in order to withstand the relatively high temperatures used during ALD growth. Plots of QCM frequency versus time and chamber pressure versus time when using the first vacuum chamber illustrated in FIGS. 3-6 for a number of ALD cycles showed that QCM frequency drops were perfectly correlated with pressure pulses and that the QCM data demonstrated a steadily decreasing linear trend, confirming that ALD growth was occurring consistently throughout the deposition and that the QCM was sensitive to the sub-Angstrom changes in thickness as the layer was grown.

Figure 5:
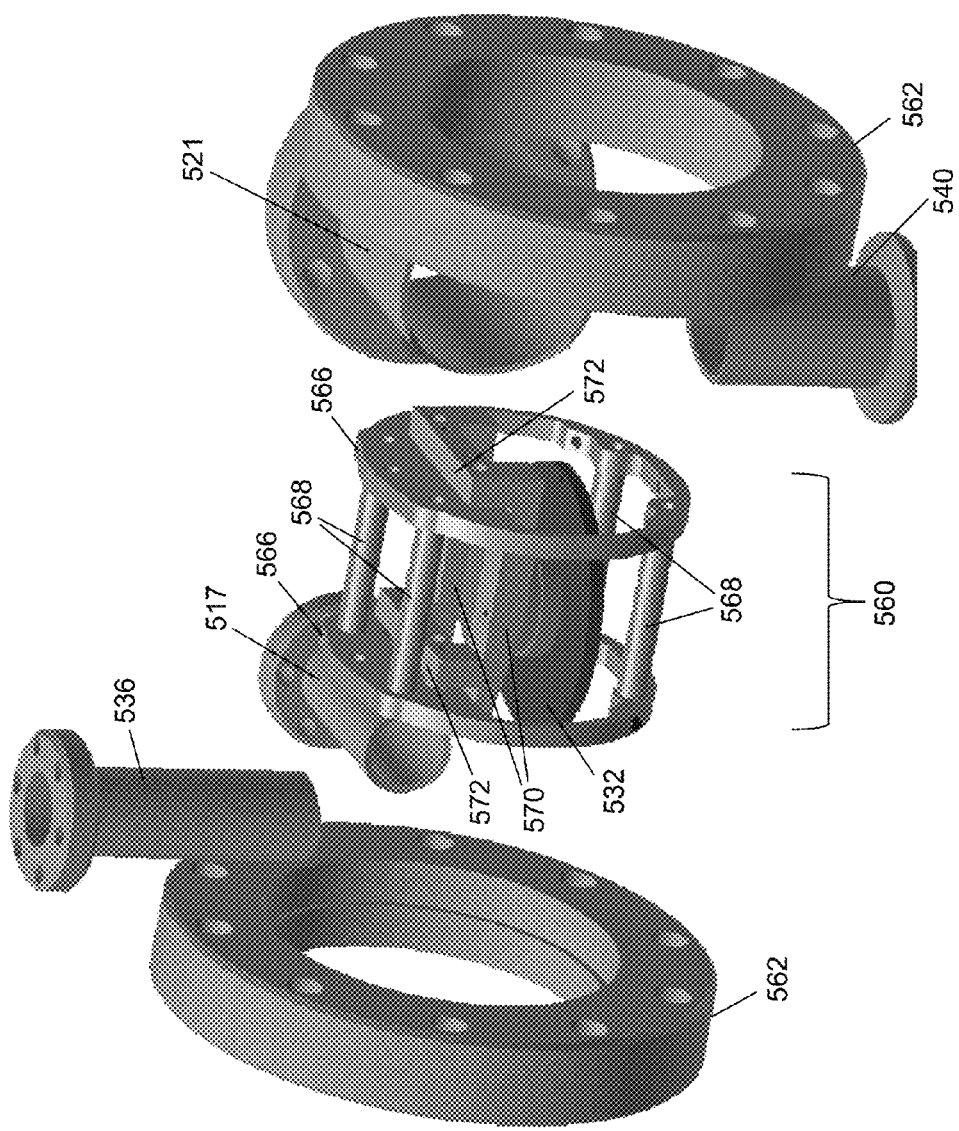
FIG. 5 shows a perspective, exploded view of a first vacuum chamber adapted for ALD according to an illustrative embodiment, showing the first stage docking assembly.
Figure 6:
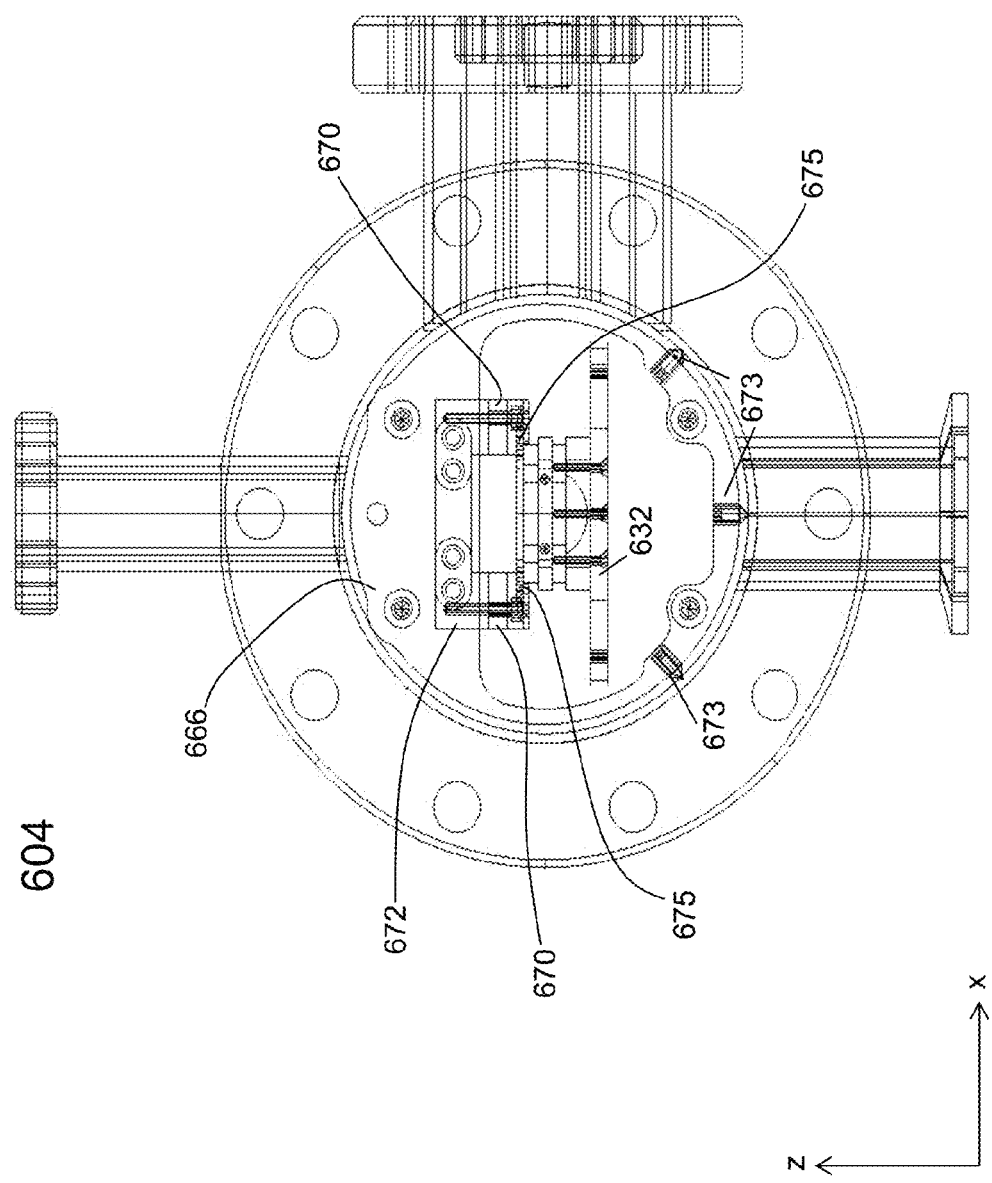
FIG. 6 shows an end view of a first vacuum chamber adapted for ALD according to an illustrative embodiment.

As noted above, the first vacuum chamber includes a first stage docking assembly configured to dock a detachable stage. Details of an illustrative embodiment of a first stage docking assembly are shown in FIGS. 5 and 6. FIG. 5 shows an exploded perspective view of a first vacuum chamber 504 in which the chamber walls have been removed to show a first stage docking assembly 560 with a detachable stage 532 docked in the assembly. Other components of the first vacuum chamber 504 are shown, including the two CF flanges 562 welded to the ends of the chamber, the gas inlet port 536, the exhaust port 540, a first additional port 517 for mounting a thermocouple and a second additional port 521 for mounting a QCM.

The first stage docking assembly 560 includes a cylindrical inset (although other shapes may be used) which is configured to fit within the interior of the first vacuum chamber 504, to accommodate the detachable stage 532 within the interior of the cylindrical inset and to allow for translation of the detachable stage 532 in and out of the cylindrical inset. The amount of material used to form the cylindrical inset (and the first stage docking assembly itself) is desirably minimized in order to facilitate (rather than disrupt) the flow of source gases from the gas inlet port 536 to a substrate mounted on the detachable stage 532. As shown in FIG. 5, the cylindrical inset includes opposing end rings 566 which define openings through which the detachable stage 532 may pass as it is being translated through the first vacuum chamber 504. The opposing end rings 566 are connected to one another through a set of rods 568.

The first stage docking assembly 560 also includes a first chuck housed within and mounted to the cylindrical inset. The first chuck is configured to couple to the detachable stage 532 (e.g., via mating with a protrusion on the detachable stage 532) and to suspend the detachable stage 532 from the top inner surface of the first vacuum chamber 504 within the interior of the chamber. The detachable stage 532 is suspended in a face-down orientation such that a substrate mounted on the detachable stage 532 faces the bottom inner surface of the first vacuum chamber 504. The first chuck includes a pair of parallel rails 570 and a pair of crossbars 572 perpendicular to the rails. The first chuck is mounted to the opposing end rings 566 of the cylindrical inset via the crossbars 572. Slots running along the longitudinal axis of the parallel rails 570 are configured to mate with a protrusion on the detachable stage 532 (e.g., a lip of a docking coupler mounted to the detachable stage 532). The slots are also configured to allow the detachable stage to pass completely through the cylindrical inset along these slots while the detachable stage 532 is being translated by the substrate transfer mechanism and to allow the detachable stage 532 to be left suspended within the interior of the cylindrical inset and first vacuum chamber 504 in a fixed position. In this way, the first chuck provides for soft-stop docking of the detachable stage 532, that is, the first chuck is capable of holding the detachable stage 532 in a fixed position but does not prevent the translation of the detachable stage 532 in either direction along the longitudinal axis of the parallel rails 570.

FIG. 6 provides an end view of the first vacuum chamber 604. One of the opposing end rings 666 of the cylindrical inset is shown. The cylindrical inset is mounted to the inner surface of the first vacuum chamber 604 via set screws 673 which pass through holes in the opposing end ring 666. An end view of the first chuck is also shown, including the pair of parallel rails 670 mounted to the opposing end ring 666 via the pair of crossbars 672 perpendicular to the rails. Element 675 represents the mating of slots along the bottom inside surface of the pair of parallel rails 670 with the lip of the docking coupler mounted to the detachable stage 632.

Second Vacuum Chamber

As noted above, the apparatus includes a second vacuum chamber adapted for a vacuum deposition technique other than ALD, e.g., ultra-high vacuum physical or chemical vapor deposition (UHV PVD or CVD). Details of an illustrative embodiment of a second vacuum chamber adapted for UHV PVD are provided in FIGS. 1-2.

As shown in FIG. 2, the second vacuum chamber 208 is constructed from a cylinder (e.g., a 20 inch OD (outer diameter) stainless steel cylinder). The second vacuum chamber 208 has a side port formed from a tube and CF flange which mounts to a flanged gate valve shared with the adjacent load lock vacuum chamber 212. The second vacuum chamber 208 may be connected to a vacuum pump (e.g., a cryopump by CTI cryogenics) through a pumping port in a chamber wall. The second vacuum chamber 208 may include additional ports in chamber walls as desired. For example, multiple pressure ports can be used to mount pressure gauges, e.g., a convectron gauge (e.g., by Brooks Automation) for relatively low vacuum from atmospheric pressure to about $10^{-4}$ Torr, a micro-ion gauge (e.g., by Brooks Automation) for relatively high vacuum to about $10^{-10}$ Torr and a capacitance manometer gauge (e.g., by MKS Instruments) to accurately cover the sputtering pressure range. The second vacuum chamber 208 may be in fluid communication with a gas source manifold via a gas inlet port. The gas source manifold may be configured to supply gases (e.g., Ar, $N_2$, $O_2$, etc.) to enable sputtering of elemental sources, nitrides, oxides, respectively. Sputtering pressure may be controlled by a throttle valve (e.g., MKS type 653) and a mass flow controller (e.g., MKS type 1159B) and is typically about 10-100 mTorr.

As shown in FIG. 1, multiple sputtering sources 148 (e.g., 3 inch or 2 inch Torus sputtering guns by Kurt J. Lesker) are mounted in the second vacuum chamber 108, each including a sputtering target. The sputtering target comprises a material capable of being sputtered onto the substrate surface (or onto a layer which has been previously deposited on the substrate) to provide one or more layers of the multilayer heterostructure. The materials which may be used for the sputtering target are not particularly limited, but typically include metals, e.g., Nb and Al. Similarly, the number of sputtering sources is not particularly limited (except by the size of the second vacuum chamber 108). When three sputtering sources are used, they may be mounted 90° apart with their central axes about 6 inches from the center of the second vacuum chamber 108, but other configurations may be used. The sputtering sources may be driven either with DC or RF power supplies. A DC power source (e.g., MKD 1.5K by Advanced Energy) has a useful range of about 14-1500 W, while a RF power source (e.g., R601 by Kurt J. Lesker) has a useful range of about 8-600 W at 13.56 MHz.

As shown in FIG. 1, the second vacuum chamber 108 includes a second stage docking assembly 144 configured to dock the detachable stage 132. Although not shown, the second stage docking assembly 144 includes a second chuck configured to couple to the detachable stage 132 (e.g., via mating with a protrusion on the detachable stage 132). The second chuck may be configured similarly to the third chuck 156 of the third stage docking assembly 152 (in the load lock vacuum chamber 112) as described in more detail below. In this way, the second chuck can also provide for hard-stop docking of the detachable stage 132. However, unlike the third chuck 156, the second chuck is formed from a conductive material, e.g., copper, instead of having a layer of an electrically insulating material. In addition, the second chuck need not include the conductive spring used in the third chuck 156. By forming the second chuck of a conductive material, the chuck may be chilled-water cooled (using water at about 4° C.) or liquid nitrogen cooled, thereby allowing a substrate mounted to the detachable stage to be cooled (e.g., to about 8° C.) when the detachable stage is docked, which is beneficial for deposition stress-free Nb films with good superconducting properties. The temperature may be monitored with a thermocouple (e.g., a k-type thermocouple by Omega).

The second stage docking assembly 144 includes a rotatable arm and handle. The second chuck for coupling to the detachable stage 132 is mounted to an end of the arm and the handle can be manually moved to rotate the arm and thus, the detachable stage 132, into position above the desired sputtering source. For example, the rotatable arm and handle may be configured such that the detachable stage 132 rests about 6 cm above the sputtering targets on the sputtering sources 148 (as measured from the surface of the substrate platform of the detachable stage 132) and such that the detachable stage 132 can be aligned with the longitudinal axis 120 of the apparatus.

Load Lock Vacuum Chamber

As noted above, the apparatus includes a load lock vacuum chamber between the first vacuum chamber and the second vacuum chamber. Details of an illustrative embodiment of a load lock vacuum chamber are provided in FIGS. 7-10.

Figure 7:
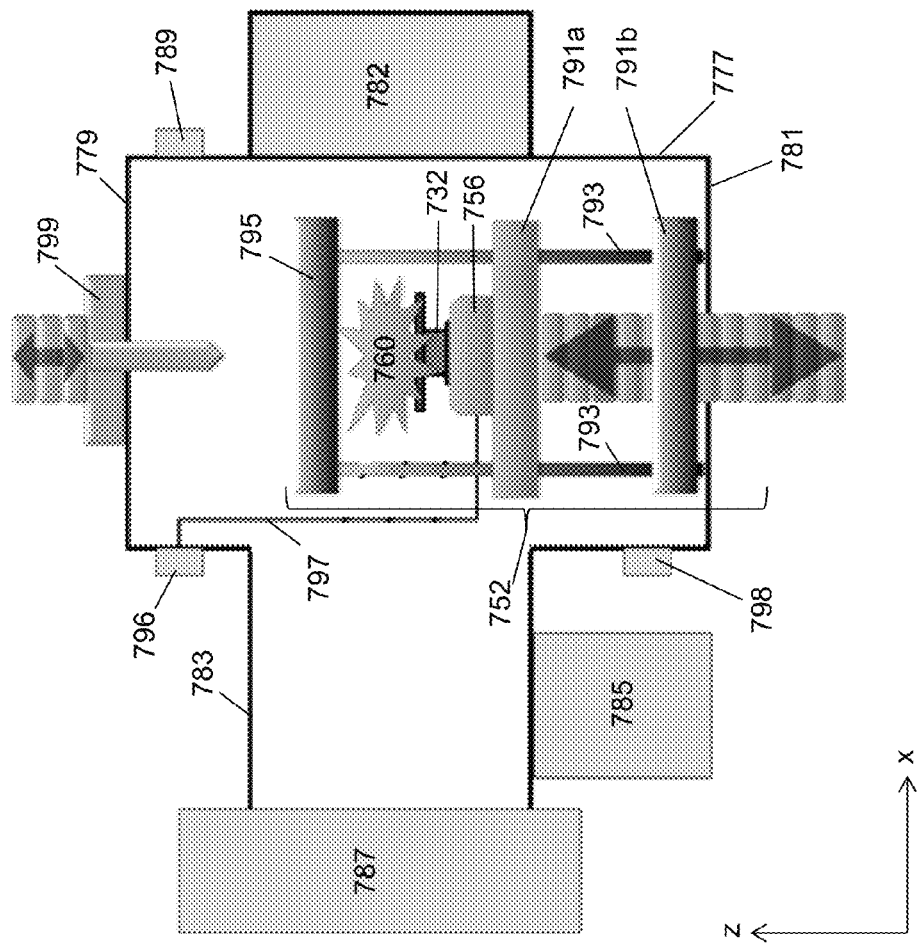
FIG. 7 shows a cross-sectional view of a schematic of a load lock vacuum chamber according to an illustrative embodiment.

A cross-sectional view of a schematic of the load lock vacuum chamber 712 is shown in FIG. 7. The load lock vacuum chamber 712 is constructed from a tube 777 (e.g., a 8 inch OD (outer diameter) stainless steel tube) having a CF flange (e.g., 10 inch ID (inner diameter)) welded to the top 779 and bottom 781 ends of the tube. Not shown in this figure are first and second side ports each formed from a tube and CF flange which mount to separate flanged gate valves. One of the side ports is coupled to the first vacuum chamber via one of the flanged gate valves and the other of the side ports is coupled to the second vacuum chamber via the other of the flanged gate valves. A front port formed from a tube and CF flange is used to mount a door 782 (e.g., an o-ring sealed door) which allows a user to manually insert a substrate into the chamber.

FIG. 7 shows that the load lock vacuum chamber 712 is connected to a vacuum pumping system through a pumping port 783 formed from another tube and CF flange. The vacuum pumping system includes a mechanically backed turbomolecular pump 785 (e.g., nExt 240 by Edwards) for evacuating the load lock vacuum chamber 712 to a desired base pressure. The vacuum pumping system further includes an ion pump 787 (e.g., LION 301 by Kurt J. Lesker) for maintaining the base pressure without introducing vibrations. The load lock vacuum chamber 712 may include additional ports in chamber walls as necessary. For example, multiple pressure ports can be used to mount pressure gauges, e.g., a convectron gauge for relatively low vacuum and a cold cathode gauge for relatively high vacuum. One such pressure port 789 is depicted in FIG. 7.

The load lock vacuum chamber 712 includes a third stage docking assembly 752 configured to dock the detachable stage 732. The third stage docking assembly 752 includes a third chuck 756 configured to couple to the detachable stage 732 (e.g., via mating with a protrusion on the detachable stage 732). The third stage docking assembly 752 further includes a frame configured to house the third chuck 756 and the detachable stage 732, the frame including spaced platforms 791a, b mounted on rods 793. The third chuck 756 is mounted to the top surface of the platform 791a which is moveable on rods 793.

The load lock vacuum chamber 712 and the third stage docking assembly 752 may be adapted for at least one treatment operation, e.g., in situ RF plasma treatments 760, of a substrate mounted on the detachable stage 732. RF plasma treatments are beneficial for the fabrication of tunnel junctions, e.g., hydrous plasma treatments are useful for achieving quality interfaces when growing ALD films on noble metals and ion milling is useful for removing native oxides from metal films to facilitate good electrical contact.

For in situ RF plasma treatments, the frame further includes a removable, grounded metal (e.g., stainless steel) plate 795 mounted on the rods 793. The metal plate 795 is configured to act as one of the electrodes for the RF plasma treatment. A linear actuator (e.g., LSM by Kurt J. Lesker) is coupled to the third chuck 756 (via the platform 791a) to provide for translation in the z-direction in order to adjust the vertical position of the detachable stage 732 and the distance between the detachable stage 732 and the metal plate 795.

To drive the plasma, the load lock vacuum chamber 712 includes a port for mounting a RF power supply and matching network 796 (e.g., R601 by Kurt J. Lesker) which is in electrical communication with the detachable stage 732 via a conductive spring (e.g., a copper-beryllium spring) embedded within the third chuck 756 and a wire 797 (e.g., a 20 gauge copper wire) connecting the conductive spring to the RF power supply/matching network 796. As further described below, the conductive spring is in electrical contact with the detachable stage 732 in order to allow the stage to act as the other electrode for the RF plasma treatment.

To provide the gases to be used to form the plasma, the load lock vacuum chamber 712 is in fluid communication with a gas source manifold 798 via a gas inlet port. The gas source manifold 798 is configured to supply gases (e.g., $O_2$, $N_2$, Ar, etc.) for a variety of plasma treatment options, e.g., oxygen plasma cleaning and Ar ion milling. This gas source manifold 798 may be shared between the load lock vacuum chamber 712 and the second vacuum chamber. A metered gate valve connected to the turbomolecular pump 785 may be used to control the operating pressure during RF plasma treatments. Using the load lock vacuum chamber 712 illustrated in FIG. 7, an ion etch rate of 1 nm/min for Nb was measured using 30 mTorr Ar, 150 W RF power and a substrate to electrode distance of 3 cm.

In addition to in situ RF plasma treatments, the load lock vacuum chamber 712 may be adapted for other in situ characterization techniques, e.g., scanning probe microscopy (SPM), scanning tunneling microscopy, spectroscopic ellipsometry, etc. Such techniques allow for the characterization of sputtered and ALD films at various points during growth, providing insight into the microstructure, electrical and optical properties of the films. As an example, FIG. 7 shows an atomic force microscope (AFM) 799 (e.g., by RHK Technology) mounted to the load lock vacuum chamber 712 via the CF flange on the top 779 of the chamber.

Figure 8:
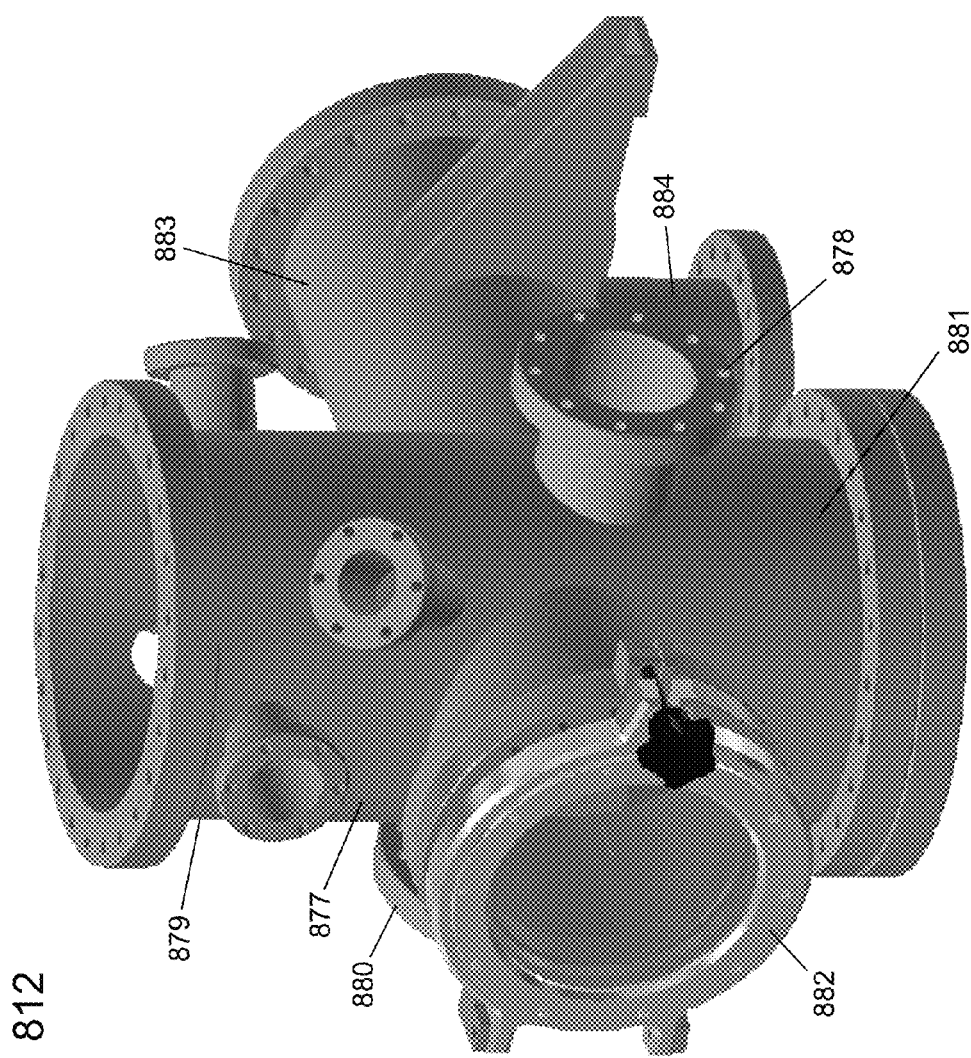
FIG. 8 shows a perspective view of a load lock vacuum chamber according to an illustrative embodiment.

FIG. 8 shows a perspective view of an illustrative load lock vacuum chamber 812. The load lock vacuum chamber 812 is constructed from a tube 877 having CF flanges welded to the top 879 and bottom 881 ends of the tube. First 878 and second 880 side ports mount to separate flanged gate valves. The first side port 878 is coupled to the first vacuum chamber via one of the flanged gate valves (e.g., a 4.265 inch ID) and the second side port 880 is coupled to the second vacuum chamber via the other of the flanged gate valves (e.g., a 6 inch ID). A door 882 is mounted to a front port on the load lock vacuum chamber 812. The load lock vacuum chamber 812 is connected to a vacuum pumping system through pumping port 883. The ion pump is mounted to the flange on the pumping port 883 and another pumping port 884 formed in the wall of pumping port 883 is used to mount the mechanically backed turbomolecular pump.

Other ports on the load lock vacuum chamber 812 (not labeled) may be used to mount pressure gauges, a RF power supply, etc.

Figure 9:
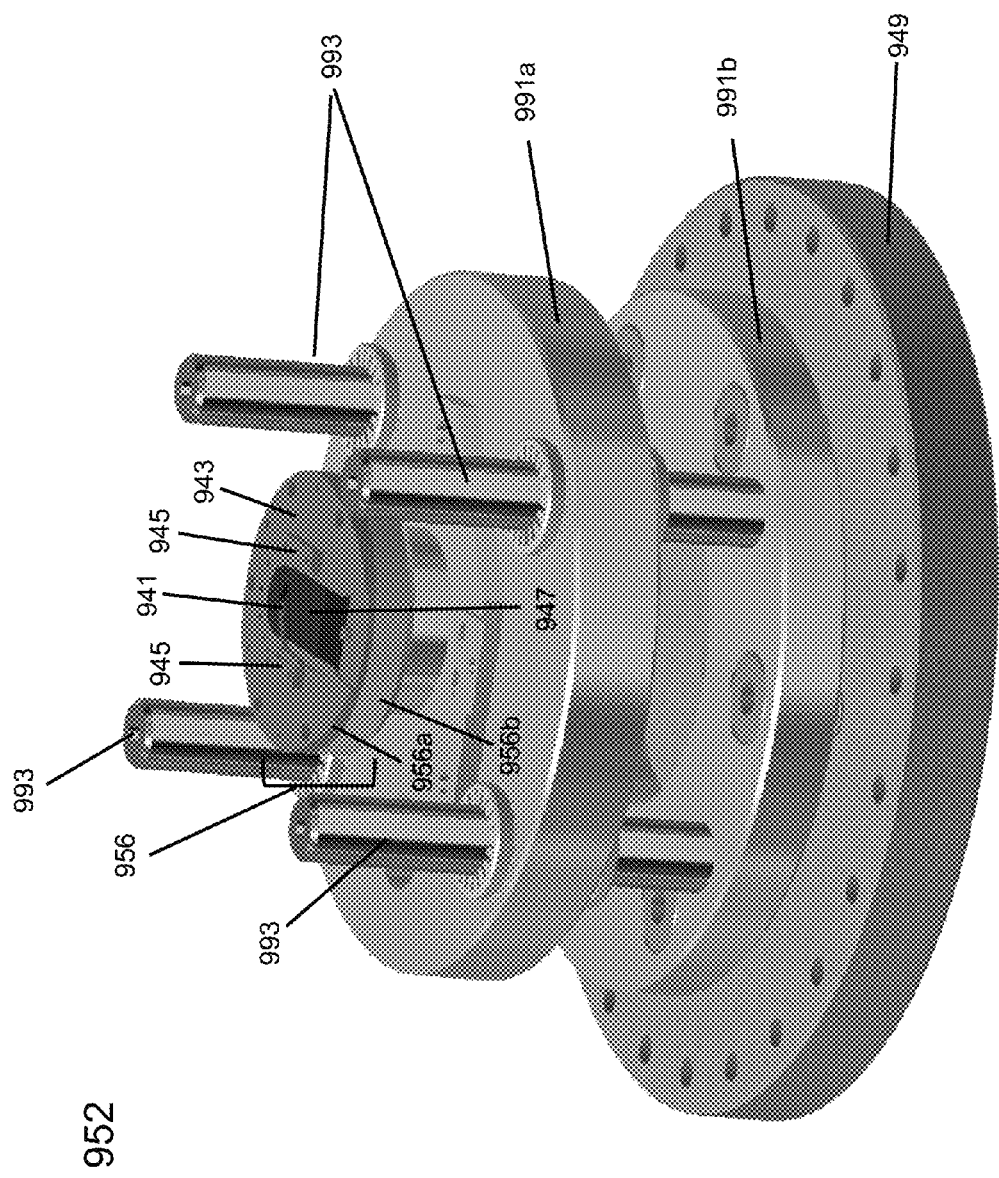
FIG. 9 shows a perspective view of a portion of a third stage docking assembly in the load lock vacuum chamber according to an illustrative embodiment.

FIG. 9 shows a perspective view of a portion of an illustrative third stage docking assembly 952. The third stage docking assembly 952 includes the third chuck 956 which is mounted to the top surface of the moveable platform 991*a* (mounting components not shown). The third chuck 956 is composed of two layers 956*a* and 956*b*. A slot 941 is formed in the top surface 943 of the upper layer 956*a*. The slot 941 is configured to mate with a protrusion on the detachable stage (e.g., a surface of a docking coupler on the detachable stage). The slot 941 is also configured to allow the detachable stage to pass into the slot while the detachable stage is being translated by the substrate transfer mechanism to a fixed position over the third chuck 956. To pass out of the slot 941 from the fixed position, the detachable stage must be translated in the opposite direction. In this way, the third chuck 956 provides for hard-stop docking of the detachable stage, that is, the third chuck 956 is capable of holding the detachable stage in a fixed position and also prevents the translation of the detachable stage in one direction along the longitudinal axis of the apparatus. In this embodiment, the slot 941 is U-shaped, although the shape is not particularly limited provided it is a shape that is complementary to the shape of a surface of the docking coupler on the detachable stage. The third chuck 956 may also include parallel rails 945 mounted to the top surface 943 which each include a notch configured to mate with a protrusion on the detachable stage (e.g., a lip of the docking coupler of the detachable stage) in order to provide further guiding and support for the detachable stage as it is translated to its fixed position.

The third chuck 956 includes the conductive spring 947 embedded in the top surface 943 which is positioned to make electrical contact with the detachable stage when it is translated to its fixed position. The third chuck 956 may be formed from a variety of materials. For example, the upper layer 956*a* may be formed from a conductive metal, e.g., copper and the lower layer 956*b* may be formed from an insulating material, e.g., Teflon. Using an insulating material for the lower layer 956*b* allows a substrate mounted to the detachable stage to be electrically isolated from the chamber during in situ RF plasma treatments.

Also shown are the other platforms 991*b* and the rods 993 of the frame configured to house the detachable stage. The frame is mounted to a CF flange 949 which, with reference to FIG. 8, is mounted to the CF flange welded to the bottom end 881 of the load lock vacuum chamber 812.

Figure 10:
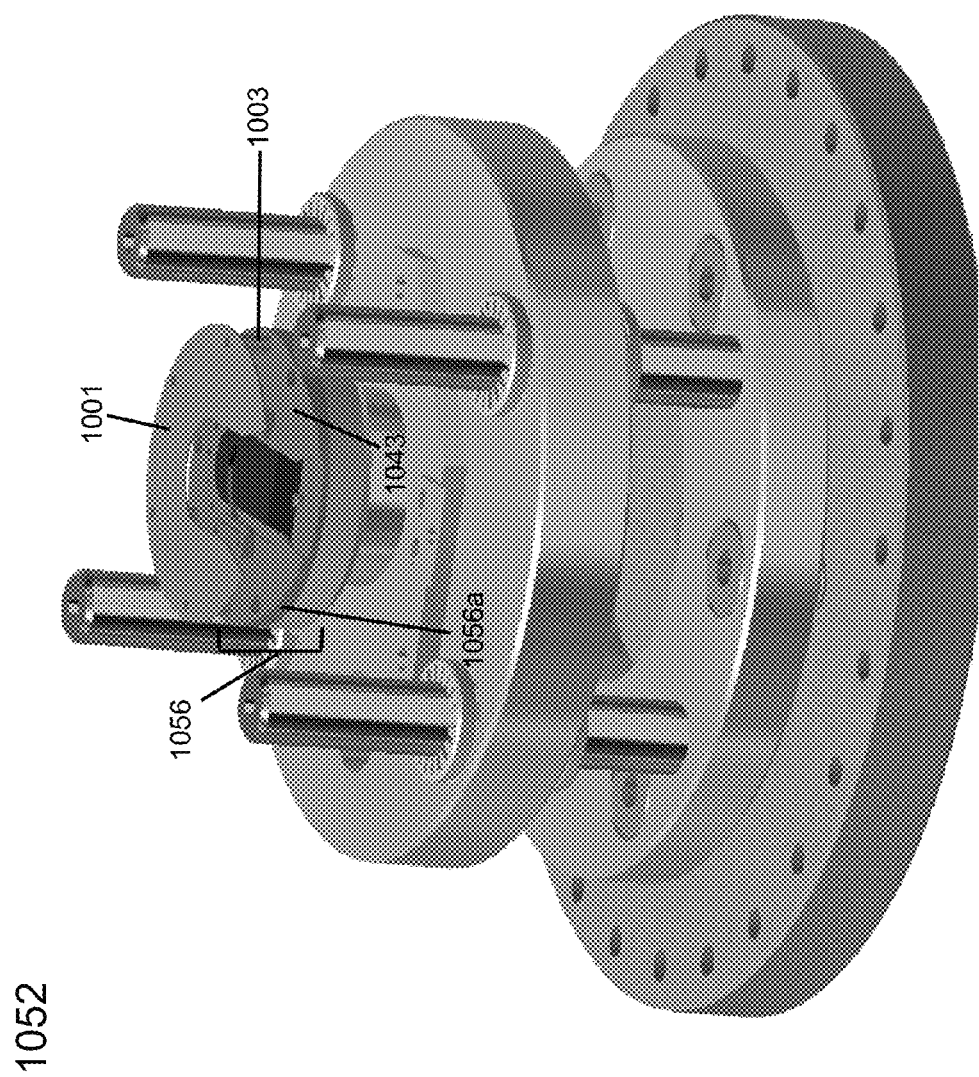
FIG. 10 shows a perspective view of another portion of a third stage docking assembly in the load lock vacuum chamber according to an illustrative embodiment.

FIG. 10 shows the same view of the illustrative third stage docking assembly 1052 of FIG. 9. However, a raised platform 1001 is mounted to the top surface 1043 of the upper layer 1056*a* of the third chuck 1056 via spacers 1003 (only one spacer is visible). The raised platform 1001 is used to raise the substrate supported by the detachable stage such that the tip of an atomic force microscope (see element 799 in FIG. 7) can reach the surface of the substrate.

Detachable Stage

As noted above, the apparatus allow for in situ fabrication of multilayer heterostructures on a substrate supported by a detachable stage. Details of an illustrative embodiment of a detachable stage are provided in FIGS. 11-12.

Figure 11:
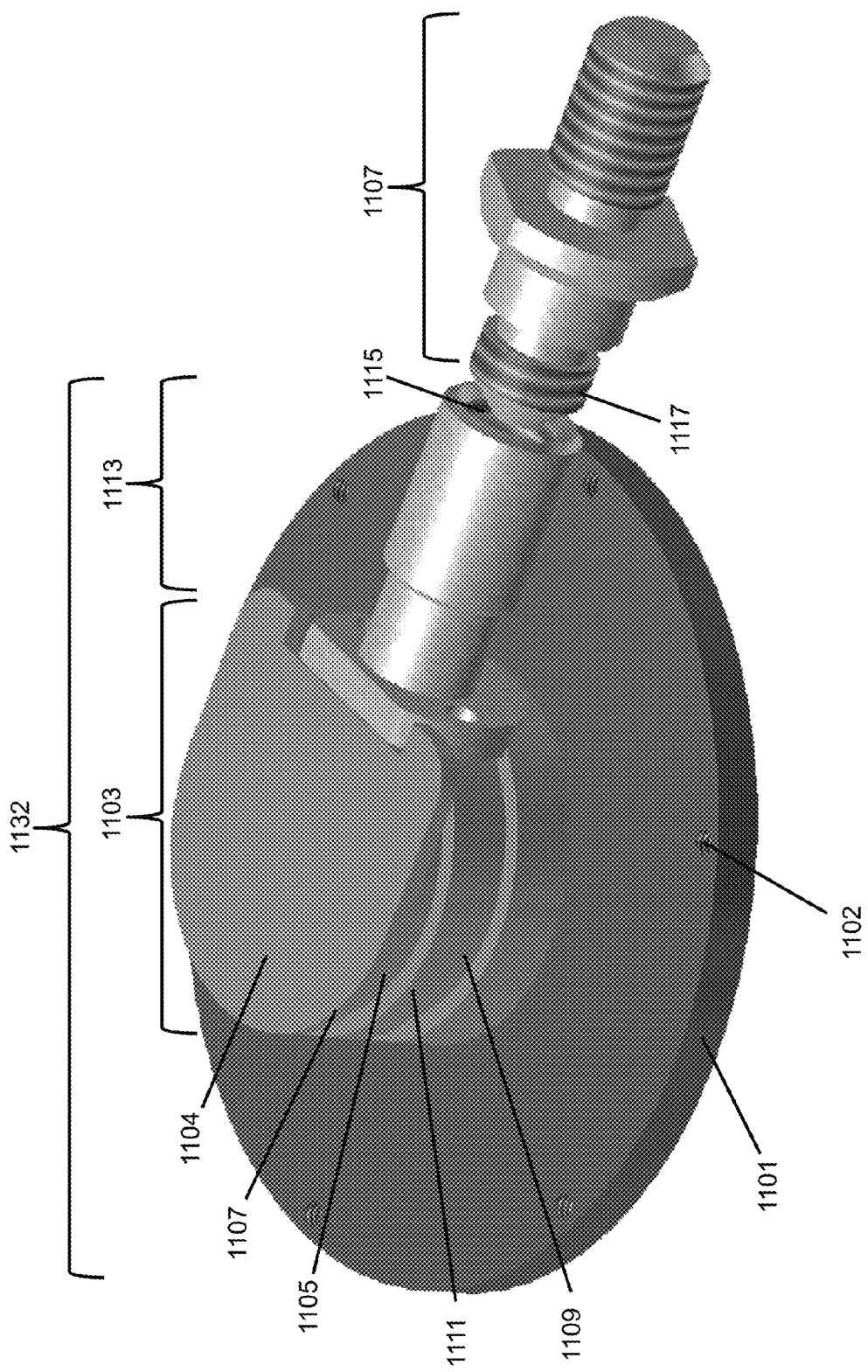
FIG. 11 shows a perspective view of a detachable stage according to an illustrative embodiment.

FIG. 11 shows a perspective view of a detachable stage 1132 which includes a substrate platform 1101 on which a substrate can be mounted. This view of the detachable stage 1132 corresponds to the orientation of the detachable stage 1132 when it is docked in the first vacuum chamber and the second vacuum chamber. (See FIG. 1.) The substrate can be mounted in a variety of ways, including via screws which correspond to threaded holes 1102 on the substrate platform 1101. A variety of materials may be used for the substrate platform, e.g., a conductive material such as copper. Copper has excellent thermal conductivity which allows for uniform heating in the first vacuum chamber during ALD growth and for uniform cooling in the second vacuum chamber during sputtering. Any materials suitable for use in the growth of the initial layer of a multilayer heterostructure may be used for the substrate itself.

The detachable stage 1132 further includes a docking coupler 1103 mounted to the surface of the substrate platform 1101. The surface of the docking coupler 1103 is shaped to mate with complementary shaped surfaces in the chucks of the first vacuum chamber, the second vacuum chamber and the load lock vacuum chamber. For example, the docking coupler 1103 is shaped to fit into the respective slots in the third chuck of the third stage docking assembly (in the load lock vacuum chamber) and the second chuck of the second stage docking assembly (in the second vacuum chamber). In particular, the perimeter of the top surface 1104 of the docking coupler 1103 has a shape complementary to that of the respective slots in the chucks of the load lock vacuum chamber and the second vacuum chamber. In this embodiment, the perimeter is U-shaped to complement the U-shaped slots in the chucks. Other shapes may be used. The docking coupler 1103 is also shaped to fit into the slots in the first chuck of the first stage docking assembly (in the first vacuum chamber). In particular, a first slot 1105 is formed a side wall of the docking coupler 1103 to provide a first lip 1107 which fits within the slots in the parallel rails of the first chuck of the first stage docking assembly. (See FIG. 6.) A second slot 1109 may be formed in a side wall of the docking coupler 1103 to provide a second lip 1111 which fits within the notches in the parallel rails mounted to the top surface of the third chuck of the third stage docking assembly. (See FIG. 9.) In this way, the docking coupler is effectively a protrusion (the male part) which mates with respective slots/notches (the female parts) in the chucks of the stage docking assemblies in each of the vacuum chambers. A variety of materials may be used for the docking coupler, e.g., a conductive material such as copper.

As shown in FIG. 11, the detachable stage 1132 may further include a stage coupler 1113 mounted to the docking coupler 1103. The stage coupler 1113 comprises a detachable mounting for detachable coupling to the substrate transport mechanism (e.g., a linear transport rod) or a coupler 1107 mounted to the substrate transport mechanism. The detachable mounting may be a threaded hole 1115 in the stage coupler 1113 which mates with a threaded end 1117 on the substrate transport mechanism or a coupler 1107 mounted to the substrate transport mechanism. A variety of materials may be used for the stage coupler 1113, e.g., stainless steel.

Figure 12:
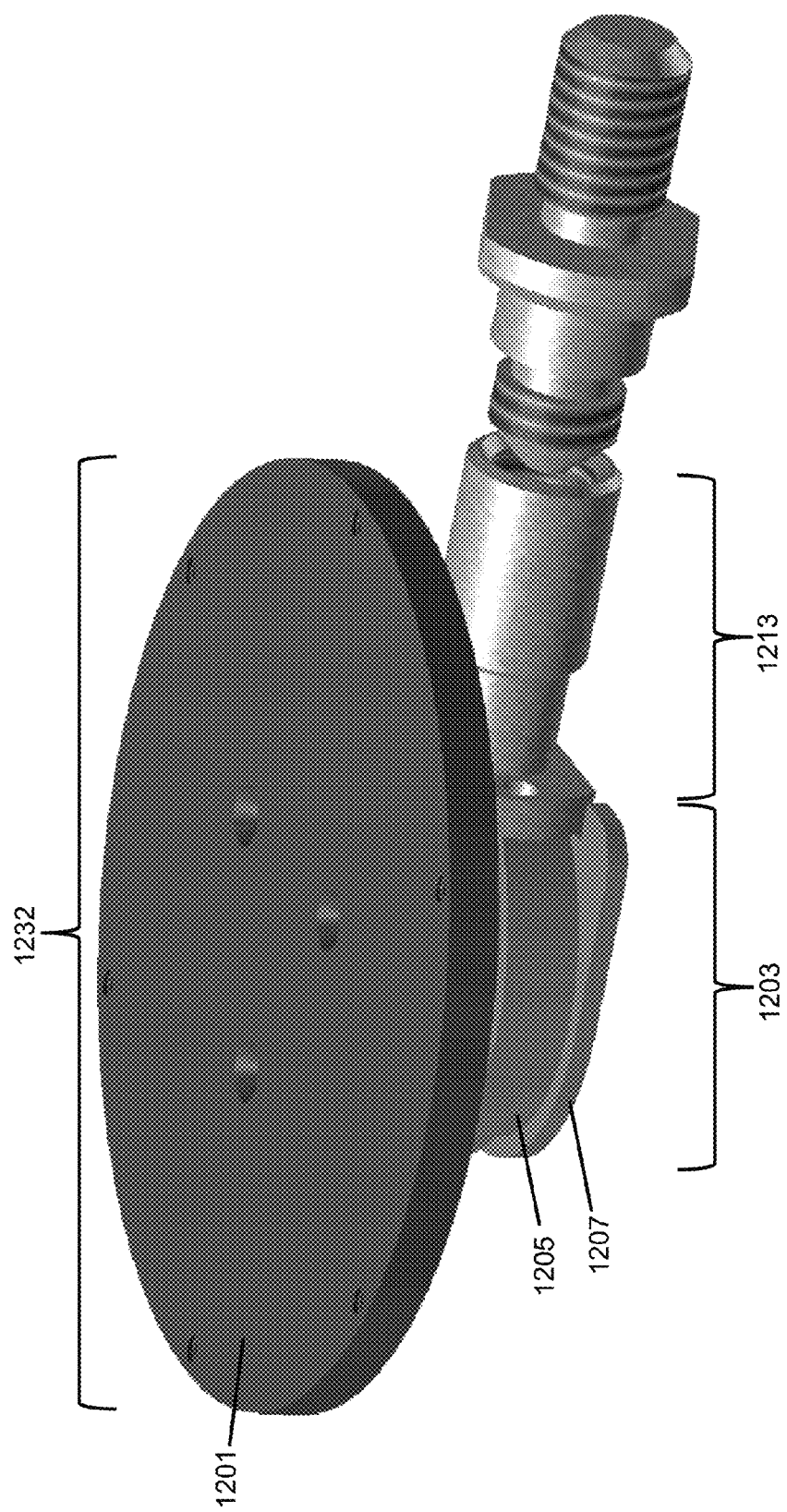
FIG. 12 shows another perspective view of a detachable stage according to an illustrative embodiment.

FIG. 12 provides another perspective view of the detachable stage 1232 which corresponds to the orientation of the detachable stage 1232 when it is docked in the load lock vacuum chamber. (See FIG. 1.) The detachable stage 1232 includes the substrate platform 1201, the docking coupler 1203 and the stage coupler 1213. As first slot 1205 is formed in a side wall of the docking coupler 1203 to provide a first lip 1207. A second slot is formed to provide a second lip (not labeled in this view).

Substrate Transport Vacuum Chamber

As noted above, the apparatus includes a substrate transport vacuum chamber comprising a substrate transfer device, the substrate transfer device configured to detachably couple to a detachable stage and to transfer a substrate supported by the detachable stage in situ between the first vacuum chamber, the second vacuum chamber and the load lock vacuum chamber. Details of an illustrative embodiment of a substrate transport vacuum chamber and a substrate transfer device are provided in FIG. 1.

As shown in FIG. 1, the substrate transport vacuum chamber 116 is constructed from a tube (e.g., a 1.5 inch OD (outer diameter), 36 inch long stainless steel tube). One end of the substrate transport vacuum chamber 116 is coupled to the first vacuum chamber 104 via a shared flanged gate valve 124a (e.g., a 2.75 inch CF gate valve).

The substrate transport vacuum chamber 116 includes a substrate transfer device 164. A variety of substrate transfer devices may be used, but desirably, the substrate transfer device is one which is configured to span a relatively large linear distance in order to transfer a detachable stage from the vacuum chamber at one end of a collinearly arranged apparatus to the vacuum chamber at the opposite end, such as the apparatus shown in FIG. 1. In some embodiments, the substrate transfer device is configured to couple to no more than a single detachable stage. A suitable substrate transfer device is a linear transport rod (e.g., a magnetically coupled transport rod by UHV Designs with a three foot stroke length). As shown in FIG. 1, one end 168 of the linear transport rod comprises a detachable mounting to the detachable stage 132 such that the detachable stage 132 can be attached to and detached from the substrate transfer device 164 as necessary. For example, when the detachable stage 132 is attached to the linear transport rod, the detachable stage 132 can be moved by moving the linear transport rod and can be transferred from one of the stage docking assemblies in one of the vacuum chambers to another one of the stage docking assemblies in another one of the vacuum chambers. Subsequently, the detachable stage 132 can be detached from the linear transport rod and the rod retracted, e.g., retracted back into the substrate transport vacuum chamber 116. The detachable mounting may be a threaded end which mates with a threaded hole in the detachable stage 132 or in a stage coupler mounted on the detachable stage 132. For example, as shown in FIG. 11, the detachable mounting is a threaded end 1117 on a coupler 1107 which mates with a threaded hole 1115 in the stage coupler 1113 mounted on the docking coupler 1103 of the detachable stage 1132. A variety of materials may be used for the coupler 1107, e.g., stainless steel.

The linear transport rod can be translated in both directions along the axis 120 such that the substrate supported by the detachable stage 132 can be transferred in situ between the first vacuum chamber 104, the second vacuum chamber 108 and the load lock vacuum chamber 112, e.g., from the first vacuum chamber 104, through the load lock vacuum chamber 112, to the second vacuum chamber 108, and back to the first vacuum chamber 104. In addition, the linear transport rod can be rotated about its longitudinal axis such that the substrate supported by the detachable stage 132 can be rotated to be positioned in a face down orientation (as shown in the first and second vacuum chambers 104 and 108) or in a face up orientation (as shown in the load lock vacuum chamber 112).

Additional Apparatus

Additional vacuum chambers, e.g., vacuum chambers adapted for additional vacuum deposition techniques for depositing additional layers in the multilayer heterostructures, may be included in the apparatus. For example, with reference to FIG. 1, a third vacuum chamber adapted for UHV PVD may be coupled to the second vacuum chamber 108 via a shared flanged gate valve. Such a third vacuum chamber may be adapted for depositing the metal layers in magnetic tunnel junctions (MTJs) or magnetic Josephson junctions. A second substrate transport vacuum chamber comprising a second substrate transfer device may be coupled to the third vacuum chamber via a shared flanged gate valve and configured to transfer a substrate supported by a detachable stage in situ between the third vacuum chamber and the second vacuum chamber. The third vacuum chamber may be configured similarly to the second vacuum chamber as described herein and the second substrate transport vacuum chamber may be configured similarly to the first substrate transport vacuum chamber as described herein. Each of the vacuum chambers in this modified apparatus may be arranged collinearly.

Any of the apparatus may further include an additional vacuum chamber adapted for at least one in situ characterization technique (e.g., ultra-high vacuum scanning probe microscopy-tip enhanced Raman spectroscopy (UHV SPM-TERS)) for a deposited layer of the multilayer heterostructure. The additional such vacuum chamber may be coupled to another vacuum chamber of the apparatus (e.g., the second vacuum chamber or the third vacuum chamber). For example, the vacuum chamber adapted for at least one in situ characterization technique may be coupled to another vacuum chamber of the apparatus via another load lock vacuum chamber. Apparatus integrating in situ characterization of deposited multilayer heterostructures enable investigation of the properties (e.g., chemical, electronic and/or structural) of surfaces and interfaces at various stages of fabrication of the multilayer heterostructures with high (e.g., nanometer or atomic) resolution and without the danger of contamination and degradation resulting from exposure to ambient conditions. As with the integration of ALD with other vacuum deposition techniques such as UHV PVD, further integration of in situ characterization techniques adds another layer of complexity and poses additional challenges such as vibrational noise from vacuum pumps coupled to other vacuum chambers (e.g., the ALD vacuum chamber) which can interfere with vibration sensitive characterization techniques such as SPM.

A perspective view of another apparatus 1700 according to an illustrative embodiment is shown in FIG. 17. The apparatus 1700 includes a first vacuum chamber 1704 adapted for ALD, a second vacuum chamber 1708 adapted for UHV PVD, a first load lock vacuum chamber 1712 between the first and second vacuum chambers, and a substrate transport vacuum chamber 1716 which includes a substrate transfer device 1764 (a linear transport rod) (only a portion of the substrate transfer device is shown). Flanged gate valves which couple and are shared between adjacent vacuum chambers and are not shown. The apparatus 1700 further includes a third vacuum chamber 1718 adapted for UHV PVD which is coupled to the second vacuum chamber 1708 via a shared gate valve (not shown). The apparatus 1700 further includes a fourth vacuum chamber 1720 adapted for at least one in situ characterization technique coupled to the third vacuum chamber 1718 and a second load lock chamber 1722 between the third and fourth vacuum chambers. The second load lock chamber 1722 is coupled to the third and fourth vacuum chambers via shared gate valves (not shown). Each of the vacuum chambers is arranged collinearly, except for the fourth vacuum chamber 1720.

The first vacuum chamber 1704, the second vacuum chamber 1708, the first load lock vacuum chamber 1712 and the substrate transport vacuum chamber 1716 have been described above. With respect to the substrate transfer device 1764, it is configured to transfer a substrate supported by the detachable stage in situ between the first vacuum chamber 1704, the second vacuum chamber 1708, the first load lock vacuum chamber 1712, the third vacuum chamber 1718 and the second load lock vacuum chamber 1722. As such, it is configured to span the relatively large linear distance from the first vacuum chamber 1712 to the second load lock vacuum chamber 1722.

As described above, the third vacuum chamber 1718 may be configured similarly to the second vacuum chamber 1708, but modifications that may be desirable for depositing different types of materials via UHV PVD may be used.

The second load lock vacuum chamber 1722 may be a vacuum chamber capable of maintaining a base pressure of about $5 \times 10^{-6}$ Torr or lower. As shown in FIG. 17, the second load lock vacuum chamber 1722 may be constructed from a tube having CF flanges welded to the top and bottom ends of the tube. First and second side ports each formed from a tube and CF flange mount to separate flanged gate valves. One of the side ports is coupled to the third vacuum chamber 1718 via one of the flanged gate valves and the other of the side ports (at 90° from the other side port) is coupled to the fourth vacuum chamber 1720 via the other of the flanged gate valves. The second load lock vacuum chamber 1722 may include additional ports as desired, e.g., pumping port(s) for connecting to a vacuum pump or pumping system, etc. The second load lock vacuum chamber 1722 may include one or more of the features described above with respect to the first load lock vacuum chamber 1712.

In FIG. 17, the fourth vacuum chamber 1720 is represented schematically. The fourth vacuum chamber 1720 may be an ultra-high vacuum chamber capable of maintaining a base pressure of about $10^{-8}$ Torr or lower. A more detailed view of an illustrative embodiment of a fourth vacuum chamber is shown in FIG. 18. FIG. 18 shows a perspective view of a fourth vacuum chamber 1820 adapted for UHV SPM-TERS according to an illustrative embodiment. Thus, the fourth vacuum chamber 1820 is adapted for at least two in situ characterization techniques. The SPM characterization technique enables topographical information to be obtained from deposited layers while the TERS characterization technique enables spectroscopic information to be obtained. The fourth vacuum chamber 1820 is constructed from a tube having CF flanges welded to the top and bottom ends of the tube. A UHV SPM system 1850 (e.g., a RHK Technology UHV STM (scanning tunneling microscopy)/AFM (atomic force microscopy) system having an optional cryostat for low temperature operation) is mounted to the CF flange at the top end of the tube. The fourth vacuum chamber 1820 includes a variety of ports. One port formed from a tube and CF flange (not shown in this view) mounts to a flanged gate valve shared with the second load lock vacuum chamber (see 1722 of FIG. 17). Other ports include optical ports used for integrating a system for UHV TERS which includes a laser beam from an appropriate laser source, a high-resolution spectrometer (e.g., WiTec Alpha300R), other optical components (e.g., beam expanders, lenses, polarizers, etc.), etc. One of the optical ports used for UHV TERS is shown as element 1857 in FIG. 18. Another port on the underside of the fourth vacuum chamber 1820 (not shown in this view) is an optical port used for UHV TERS via back illumination of transparent samples. These or other optical ports may be used to integrate a system for the local excitation of samples by a continuous wave (CW) laser or white light source (which can be correlated with tunneling current measurements by SPM). Instead of a CW laser/white light source, an ultrafast laser source may be used to perform a variety of spatially and temporally resolved measurements. Another port 1854 is used for mounting a transfer fork configured to mate with a protrusion on the detachable stage (e.g., a surface of a docking coupler on the detachable stage). The rod 1856 of the transfer fork is shown in FIG. 18. Other ports may include pumping port(s) for connecting to a vacuum pump or pumping system, etc.

FIG. 19 depicts an illustrative optical set-up for in situ local optical excitation and spatially resolved Raman spectroscopy of deposited layers of a multilayer heterostructure using the fourth vacuum chamber shown in FIG. 18. The fourth vacuum chamber 1920 is shown schematically as a box. The SPM tip 1951 from a mounted UHV SPM system is shown. Three optical ports 1952*a-c* of the fourth chamber 1920 are also shown. The first two optical ports 1952*a, b* are used for integrating a system for UHV TERS which includes a laser beam 1958 from an appropriate laser source, a spectrometer 1959, and various optical components (a beam expander 1960 and lenses 1962*a, b*). In the reflection geometry for UHV TERS depicted in the upper dashed box, a light pulse is directed to the upper surface of the sample underneath the SPM tip 1951. To provide a small spot size for the spatially resolved measurement, the laser beam 1958 passes through a beam expander 1960 in order to increase the beam size (e.g., to about 25 mm) and is then focused on the sample by a lens 1962*a* located outside the fourth vacuum chamber 1920 (e.g., about 100 mm outside the chamber). Using this configuration, a small spot size (e.g., about 10 µm) can be achieved. The reflected beam is then directed to a spectrometer 1959 for recordation of a Raman spectrum with sub-µm spatial resolution due to the tip-enhancement effect. In the transmission geometry for UHV TERS depicted in the lower dashed box, the third optical port 1952*c* enables back illumination of transparent samples. The laser beam 1964, spectrometer 1966, beam expander 1967 and beamsplitter 1968 are labeled. The focusing lens 1970 is placed inside the fourth vacuum chamber 1920 to allow a much smaller working distance, which can further enhance the spatial resolution of the Raman probe (e.g., to the sub-100 nm regime). As discussed above, these or other optical ports may be used to integrate a system for local optical excitation of samples using a CW laser, a white light source or an ultrafast laser source.

FIG. 20 shows an illustrative adjustable height dual frame platform 2024 configured to support a fourth vacuum chamber and to support a variety of components (e.g., control components) associated with the fourth vacuum chamber. The dual frame platform includes a first frame and a second frame. As shown in FIG. 17, the first frame of the dual frame platform 1724 is configured to support a plurality of vibration isolators 1726 (e.g., Newport S-2000) which, in turn, support an upper platform 1728 on which the fourth vacuum chamber 1720 is mounted. Returning to FIG. 20, the first frame includes three pads 2026 connected by bars 2028. The pads 2026 are configured to support the vibration isolators 1726 shown in FIG. 17. The bars 2028 are arranged in the shape of a triangle, with the pads 2026 at the vertices of the triangle (although other shapes are possible using additional bars and pads). The height of the first frame is adjustable, e.g., via legs 2030 mounted on feet 2032 having threaded ends which mate with threaded holes in the legs 2030. A second frame includes bars 2034 arranged in the shape of a rectangle (although other shapes are possible). Various components associated with the fourth vacuum chamber are supported by the second frame of the dual frame platform 2024. The height of the second frame is independently adjustable, e.g., via feet 2035 having threaded ends which mate with threaded holes in the bottom surface of the bars 2034. The second frame is mounted to the first frame, e.g., via pedestals 2036 on the first frame which are configured to support the feet 2035 of the second frame. In order to accommodate the different shapes of the first frame and the second frame, the first frame further includes a cross-bar 2038 which includes two of the pedestals 2036. The height adjustable dual frame platform 2024 allows for both the fourth vacuum chamber and its associated components to be supported, while isolating the fourth vacuum chamber from vibrations associated with those components or other components of the apparatus.

FIG. 21 shows an illustrative docking coupler 2103 of the detachable stage. This view of the docking coupler 2103 corresponds to the view shown in FIG. 12 (the substrate platform is not shown). The surface of the docking coupler 2103 is shaped to mate with a complementary shaped surface of a transfer fork of the fourth vacuum chamber. The rod 1856 of the transfer fork is shown in FIG. 18. As shown in FIG. 21, the opposite end 2157 of the transfer fork is U-shaped, providing tines 2159*a, b*. This shape is complementary to the cylindrically shaped docking coupler 2103, but other complementary shapes may be used. FIG. 21 also shows a stage coupler 2113 mounted to the docking coupler 2103. The stage coupler 2113 includes a detachable mounting for detachable coupling to the substrate transport mechanism (e.g., a linear transport rod). The detachable mounting may be a threaded end 2114 which mates with a threaded hole on the substrate transport mechanism. The opposite end of the stage coupler 2113 may be a threaded end 2115 which mates with a threaded hole 2116 in the docking coupler 2103. The stage coupler 2113 may be a coupler that is associated with the substrate transfer device (see 1107 in FIG. 11), rather than a component of the detachable stage.

Apparatus integrating in situ characterization of deposited multilayer heterostructures such as the apparatus illustrated in FIGS. 17-21 find use in a variety of applications. For example, the apparatus may be used to grow the Nb/Al/Al$_2$O$_3$/Nb heterostructures described in the Examples below and to probe and characterize the microscopic nature and density of chemical species and/or structural defects of the ALD grown tunnel barrier during the fabrication process.

Methods

Methods for the in situ fabrication of multilayer heterostructures using the disclosed apparatus are also provided. In a basic embodiment, the methods comprise moving a substrate supported by the detachable stage via the substrate transfer device from the third stage docking assembly in the load lock vacuum chamber to one of either the first stage docking assembly in the first vacuum chamber or the second stage docking assembly in the second vacuum chamber; depositing a layer of a first material onto the substrate using one of atomic layer deposition (ALD) or the vacuum deposition technique of the second vacuum chamber, e.g., ultrahigh vacuum physical vapor deposition (UHV PVD); moving the substrate via the substrate transfer device to the other of either the first stage docking assembly in the first vacuum chamber or the second stage docking assembly in the second vacuum chamber; and depositing a layer of a second material onto the layer of first material via the other of either ALD or the vacuum deposition technique of the second vacuum chamber. Each of the steps in the method occurs in situ.

As another illustrative embodiment, the following method may be used for in situ fabrication of a multilayer heterostructure using the apparatus illustrated in FIGS. 1-12, including fabrication of a metal-insulator-metal heterostructure.

First (1) a substrate is mounted to the detachable stage and the detachable stage is docked in the third docking stage assembly of the load lock vacuum chamber. Next (2), the linear transport rod is moved into the load lock vacuum chamber and the detachable stage is attached to the linear transport rod. Next (3), the load lock vacuum chamber, the first vacuum chamber adapted for ALD and the substrate vacuum chamber are pumped to high vacuum. Next (4), the shared gate valve between the load lock vacuum chamber and the second vacuum chamber is opened and the detachable stage is transferred to the second docking stage assembly of the second vacuum chamber. Next (5), after detaching the detachable stage from the linear transport rod and retracting the linear transport rod into the load lock vacuum chamber, this shared gate valve is closed. Next (6), the detachable stage is cooled to a desired temperature. Next (7), once the desired sputtering source has been turned on and stabilized, the detachable stage is rotated into the vapor cloud produced by the sputtering source for deposition of a first layer of a desired material (e.g., Nb) on the substrate via UHV PVD. Next (8), after the desired film thickness is reached, the detachable stage is rotated out of the vapor cloud. If desired, other layers of other desired materials may be deposited on the first layer in the second vacuum chamber (e.g., Al or Pd).

Next (9), when deposition in the second vacuum chamber is complete, the shared gate valve between the load lock vacuum chamber and the second vacuum chamber is opened, the detachable stage is reattached to the linear transport rod, and the detachable stage is transferred to the first docking stage assembly of the first vacuum chamber. Next (10), after detaching the detachable stage from the linear transport rod and retracting the linear transport rod into the substrate transfer vacuum chamber, all shared gate valves in the apparatus are closed to isolate the first vacuum chamber. Next (11), nitrogen flow is introduced into the ALD chamber to a steady pressure maintained by the mechanical pump. Next (12), the first vacuum chamber is heated to a desired temperature. Next (13), the appropriate gas sources are pulsed into the chamber via a sequence sufficient to deposit a second layer of a desired material (e.g., Al$_2$O$_3$) on the first layer of material via ALD. Next (14), the heating elements are turned off, nitrogen flow is turned off and the shared gate valve between the first vacuum chamber and the substrate vacuum chamber and the shared gate valve between the first vacuum chamber and the load lock vacuum chamber are opened. Next (15), the detachable stage is reattached to the linear transport rod and the detachable stage is transferred to the third docking stage assembly of the load lock vacuum chamber where it is allowed to cool to a desired temperature (e.g., about 50° C.).

Next (16), in order to deposit a third layer of a desired material (e.g., Nb) on the second layer of material via UHV PVD, steps (4)-(8) are repeated. Next (17), the shared gate valve between the load lock vacuum chamber and the second vacuum chamber is opened, the detachable stage is reattached to the linear transport rod, and the detachable stage is transferred to the third docking stage assembly of the load lock vacuum chamber. Next (18), this shared gate valve is closed (and if desired, the shared gate valve between the load lock vacuum chamber and the first vacuum chamber), the load lock vacuum chamber is brought to atmospheric pressure and the detachable stage is detached from the linear transport rod and removed from the load lock vacuum chamber.

Example

This example illustrates the use of the present apparatus for the fabrication of a Nb/Al/Al$_2$O$_3$/Nb heterostructure.

Nb/Al/ALD-Al$_2$O$_3$/Nb Trilayer Fabrication

Using the apparatus illustrated in FIGS. 1-12, Nb/Al/Al$_2$O$_3$/Nb trilayers were fabricated and then patterned into JJ arrays using advanced photolithography in combination with electron beam lithography. For comparisons, JJs made on traditional thermal Nb/Al/AlOx/Nb trilayers were also fabricated, in which Al was used as the source material for the thermally oxidized AlOx tunnel barrier. In the case of trilayers with ALD tunnel barriers, Al was also adopted as a wetting layer to facilitate the nucleation of ALD-Al$_2$O$_3$ and to prevent the formation of Niobium oxide (NbOx). NbOx has three oxidation states, only one of which is insulative, so preventing the formation of NbOx is critical to reproducible junction fabrication. The Nb films were sputtered in 14 mTorr Ar at 330 W DC, which yielded a power density of 46 W/in$^2$ and hence a high growth rate of 1.7 nm/s to minimize the formation of NbOx caused by traces of residual oxygen in the UHV sputtering chamber. For this work, the bottom electrode was 150 nm, and the top electrode was 50 nm. The Al wetting layer was sputtered in 14 mTorr Ar at 90 W DC to a thickness of 7 nm. The same thicknesses of Nb and Al were adopted in the thermal Nb/Al/AlOx/Nb trilayers. For the trilayer with an ALD tunnel barrier, 2-20 cycles (0.2 nm-2.4 nm) of ALD-Al$_2$O$_3$ growth occurred at 200° C. with TMA and H$_2$O. A reference trilayer was also made that went through the ALD heating and cooling cycle, but was not exposed to the ALD reaction. For the traditional trilayers with a thermal oxide tunnel barrier, the Al wetting layer was exposed to either 1 Torr or 100 Torr of O$_2$ for ~3.5 hours in the sputtering chamber before the top Nb was sputtered. These pressure-times correspond to target critical current densities of 500 A/cm$^2$ and 50 A/cm$^2$, respectively.

The surface morphology of these trilayers was studied with contact mode atomic force microscopy (AFM). The AFM characterizations show the surface roughness of the bottom Nb layer was not substantially increased by growing ALD-Al$_2$O$_3$ on top of the Al wetting layers. The surface of the bottom Nb layer is smooth with an average roughness R$_{rms}$ of ~1 nm. The Al wetting layers still have comparable smoothness with R$_{rms}$, of ~1.1 nm. With 14 cycles of ALD-Al$_2$O$_3$ the R$_{rms}$, is ~1.3 nm. These morphologies confirm that ALD growth does not significantly alter the smoothness of the base surface and excludes the possibility of island growth modes.

Current-in-plane tunneling (CIPT) measurements were taken on the unpatterned trilayers to confirm the integrity of the tunnel barrier at room temperature. CIPT measurements were performed on trilayers with the number of ALD cycles ranging from 2-20. The reference trilayer with 0 cycles was also measured. In the latter case, the tunnel resistance was too low to measure using CIPT, indicating the heating/cooling process in ALD did not cause significant oxidation of the Al wetting layer. For the other trilayers, the tunneling resistance was clearly identified by CIPT. In fact, a monotonic increase of the tunneling resistance with the number of the ALD cycles was been observed. (See R. Lu, A. J. Elliot, L. Wille, B. Mao, S. Han, J. Z. Wu, J. Talvacchio, H. M. Schulze, R. M. Lewis, D. J. Ewing, H. F. Yu, G. M. Xue, and S. P. Zhao, Applied Superconductivity, IEEE Transactions on 23 (3), 1100705 (2013).) In addition, uniform tunneling resistance with a small standard deviation of less than 10% was observed on most samples with diameters up to 50 mm confirming good control of the tunnel resistance by varying the number of ALD cycles.

ALD Interfacial Layer (IL) Characterization

ALD-AL$_2$O$_3$ was grown on sputtered Al substrates to probe the nucleation and measure the thickness of any IL that may form during ALD growth. Two sets of samples were fabricated. For the first set, ~50 nm Al was sputtered in 14 mTorr Ar at 90 W DC, and 0-100 cycles of ALD-Al$_2$O$_3$ were grown. For the second set, 0.1-1.0 nm Al was sputtered in 14 mTorr Ar at 15 W DC, and 60 cycles of ALD-Al$_2$O$_3$ were grown. The ALD-Al$_2$O$_3$ films' morphologies were characterized with AFM, and their thicknesses were measured with spectroscopic ellipsometry.

Figure 13:
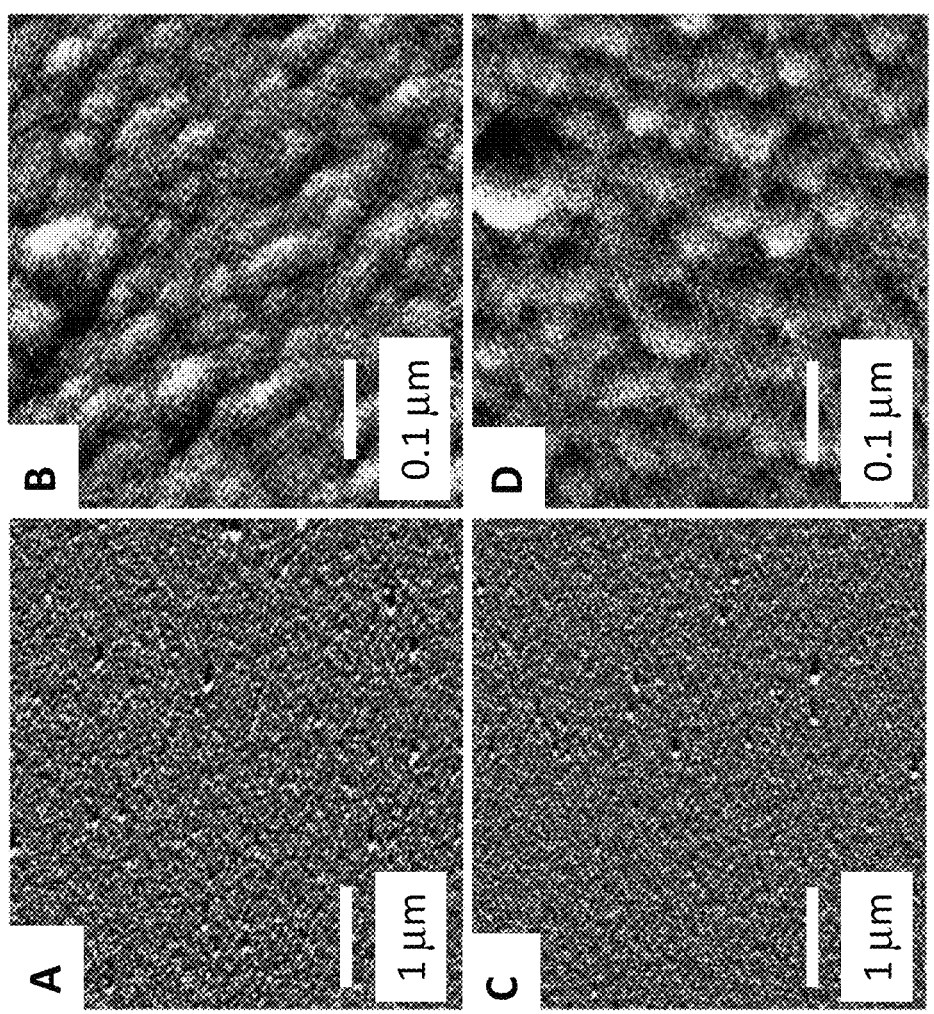
FIG. 13 shows AFM deflection images of the native oxide on 50 nm sputtered Al (A and B) and 20 cycles of ALD $Al_2O_3$ grown on 50 nm in situ sputtered Al (C and D) over 5×5 µm (A and C) and 500×500 nm (B and D) scan windows. Topography measurements yield RMS roughness of 1.1 nm on the native oxide and 1.3 nm on the ALD oxide, confirming conformality. Scale bars: 1 µm (A, C); 0.1 µm (B, D).

FIG. 13 presents ex situ AFM deflection images of the morphology of the native oxide on 50 nm sputtered Al (A and B) and 20 cycles of ALD-AL$_2$O$_3$ grown on 50 nm Al sputtered in situ (C and D). Surface roughness measurements yield R$_{rms}$=1.1 nm for the native oxide and R$_{rms}$=1.3 nm for the ALD film. Surface roughness measurements on 20-100 cycles of ALD-AL$_2$O$_3$ grown on Al all showed comparable R$_{rms}$~1 nm. These comparable roughness values between the Al native oxide and varied thicknesses of ALD-Al$_2$O$_3$ grown on Al confirm the highly conformal nature of ALD-Al$_2$O$_3$ grown on Al.

Figure 14A:
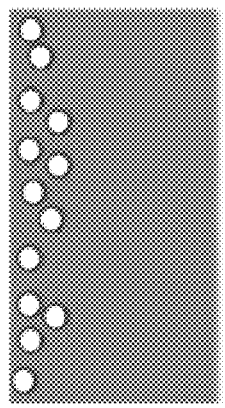
FIG. 14 illustrates the existence of four distinct oxidation regimes when growing ALD $Al_2O_3$ in situ on Al substrates. A very thin thermal oxide forms during the ALD heating process from trace $H_2O$ in the chamber (A). If the ALD film is not thick enough to act as a diffusion barrier against ambient oxygen, a native oxide will form underneath the ALD film (B). During long ALD depositions, ALD growth and thermal oxidation occur together, which forms a significant interfacial layer (C). However, if a thin ALD film is capped with a diffusion barrier, both co-growth and ambient oxidation can be minimized (D), as is the case with tunnel junction fabrication.
Figure 14B:
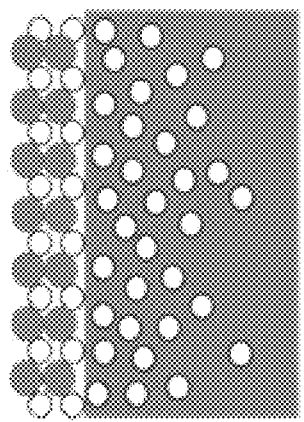
Figure 14C:
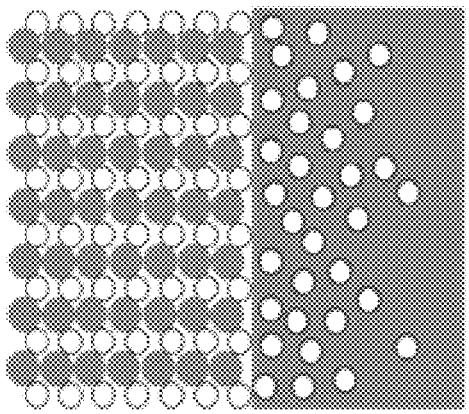
Figure 14D:
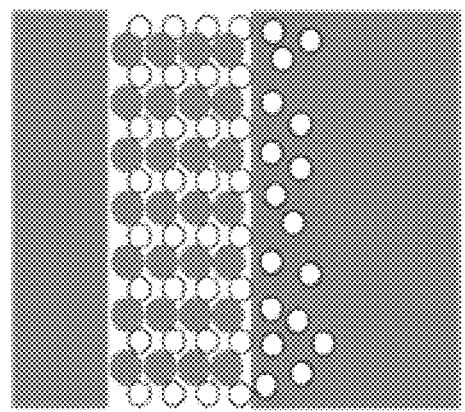

The ellipsometry results from the ALD-Al$_2$O$_3$ grown on 50 nm Al showed a growth rate of 1.19 Å/cycle, consistent with previous reports of ALD Al$_2$O$_3$ on a variety of other substrates. (See also A. J. Elliot, G. Malek, L. Wille, R. T. Lu, S. Han, J. Z. Wu, J. Talvacchio, and R. Lewis, Applied Superconductivity Conference 2012 (2012).) The non-zero y-intercept of the trendline indicated an IL of ~2 nm was formed. It is thought that this IL is thermally grown aluminum oxide (AlOx) that results from a combination of two growth mechanisms. The first mechanism is simple thermal oxidation while heating up the ALD chamber. In order to confirm this, a sample was heated to 200° C. in ALD chamber over the heating and cooling course of ~1-2 hours without ALD. JJ arrays were fabricated using the same micro-fabrication procedure and the current-voltage characteristics of these reference Hs produced with 0 ALD cycles (further discussed below). The measured critical current density of 9.5 kA/cm$^2$ was far too large for a ~2 nm tunnel barrier, suggesting the formation of a substantial IL oxide during ALD heating is unlikely. The second mechanism is diffusion oxidation during the ALD process. Since a bare Al surface is exposed to H$_2$O at 200° C., some oxidation will occur. The total thickness of this oxide depends on the temperature, the partial pressure of oxygen, and the total number of ALD cycles performed. These two mechanisms, in combination with oxidation upon exposure to ambient atmosphere, produce four scenarios for ultrathin ALD film growth on Al. FIG. 14 is a cartoon representation of these scenarios. FIG. 14A, shows an AlOx IL formed from in situ oxidation that occurs during the ALD heating process from traces of H$_2$O in a heated chamber; a very thin oxide is formed on the Al surface. If an ALD film is grown that is too thin to prevent diffusion of ambient oxygen, then a native oxide will form from ex situ oxidation underneath the ALD film when the sample is removed as shown in FIG. 14B. For longer ALD depositions and thicker films, ALD growth and diffusion oxidation will occur together during the ALD process, producing co-growth and a substantial AlOx IL as shown in FIG. 14C. It is hypothesized that the additional ~2 nm of Al$_2$O$_3$ as evidenced by the ellipsometry results can be explained by co-growth, and this mechanism is consistent with previous reports of high growth rates during the nucleation of ALD on other, easily oxidized metals. However, as shown in FIG. 14D, if a thin ALD film is grown and then capped with a diffusion barrier (such as an Al or Nb top electrode), both co-growth and ambient oxidation can be minimized, producing a tunnel barrier that is dominated by ALD growth. Co-growth is controlled by temperature, oxygen partial pressure, and the oxidizability of the substrate, so careful tuning of the ALD processing parameters and/or substrate engineering can produce a crisp MI interface.

To confirm these hypotheses, and to set a lower limit on the IL formed during in situ ALD, 60 cycles of ALD-$Al_2O_3$ was grown on ultrathin 0.15-1.0 nm Al, which was sputtered onto Si(100). The ex situ ellipsometry results of this study showed a monotonic increase in ALD-$Al_2O_3$ thickness with increasing Al wetting layer thickness. This confirmed that the IL is formed by the thermal oxidation of the underlying Al wetting layer. Further, by using only ~0.15 nm of Al as a wetting layer, the AlOx IL can be reduced to ~0.25 nm. Therefore, by using ultrathin Al wetting layers in Hs, the tunnel barrier thickness can be dominated by ALD-$Al_2O_3$ instead of the thermally oxidized IL.

Josephson Junction Fabrication and Characterization

Figure 15:
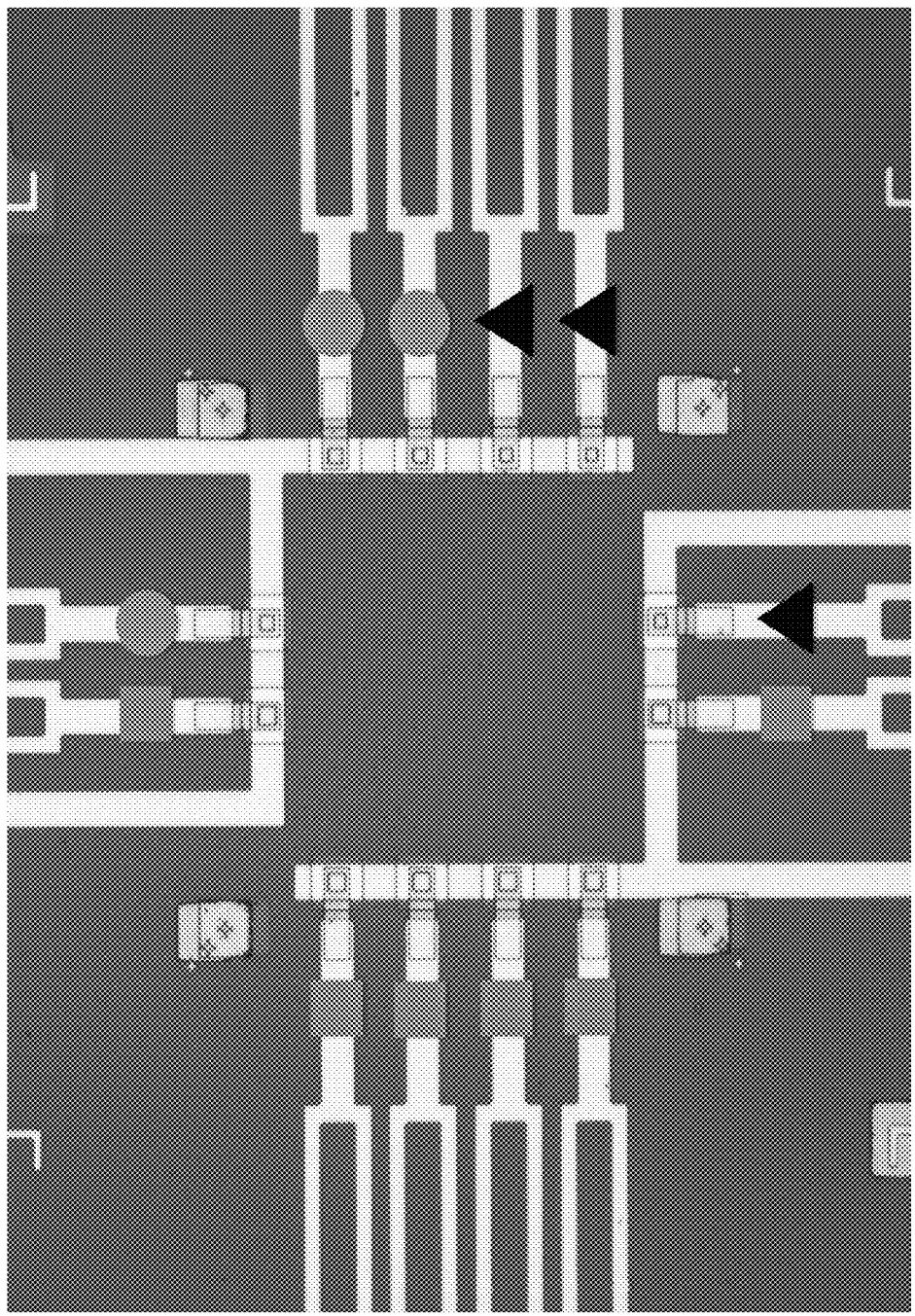
FIG. 15 shows a 10× optical micrograph of a completed JJ chip. Each chip contains 12 JJs, which are either 10×10 $µm^2$ (squares), 8×8 $µm^2$ (circles), or 7×7 $µm^2$ (triangles) nominal size. The bifurcated electrical leads allow for 4 point measurement with small residual resistances of <20Ω.

To characterize the electrical performance of ALD-$Al_2O_3$ tunnel barriers, JJs were fabricated from Nb—Al/ALD-$Al_2O_3$/Nb trilayers, and JJs made from thermally oxidized Nb—Al/AlOx/Nb trilayers served as a reference. The number of ALD cycles was ranged from 5-13, and the thermally oxidized target $J_c$ was varied from 50 A/$cm^2$ to 500 A/$cm^2$. The nominal dimensions of the JJs ranged from 3×3 μ$m^2$ to 10×10 μ$m^2$, though 3D profilometry (Tencor P16) indicated that processing reduces these nominal dimensions by ~1.5 μm on each side. The resistance of JJs with nominal dimensions ranging from 7×7 μ$m^2$ to 10×10 μ$m^2$ was measured at room temperature using a 4 point probe station. FIG. 15 shows a 10× optical micrograph of the test circuit used in the 4 point measurements. There was a small (<20Ω) residual resistance at room temperature in this 4 point configuration, and these residual resistances were measured directly on a sample that did not go through the junction definition processing. Table 1 shows the results of this room temperature analysis according to the well-known Ambegaokar-Baratoff formula, $R_N=\pi\Delta/2eJ_cA$, where $R_N$ is the normal state resistance of the JJ, Δ is the superconducting gap energy, e is the charge of an electron, $J_C$ is the critical current density of the junction, and A is the area of the junction. This formula can be linearized by plotting $R_N$ vs. 1/A, and the slope of the trend line is $\pi\Delta/2eJ_C$. Since π, Δ, and e are constants, $J_C$ was calculated directly from this slope; these values are given as $J_C$ in Table 1. Alternatively, $J_C$ can be calculated for a single JJ with measurements of $R_N$ and A; the standard deviation of these calculation is given as the uncertainty in $J_C$ in Table 1 based on multiple devices of the same dimensions. A monotonic decrease in $J_C$ with increasing ALD thickness was observed, from $J_C$=770 A/$cm^2$ for 5 cycles to $J_C$=32 A/$cm^2$ for 13 cycles. Further, the specific tunnel resistance ($R_NA$) was comparable across the range of areas for all tested JJs, and $R_NA$ increased monotonically with increasing ALD thickness. The large uncertainties in the $J_C$ and $R_NA$ measurements are attributed to inhomogeneity in device parameters such as JJ size. This is consistent with the aforementioned CIPT results, which indicate uniform tunnel barrier development on unpatterened trilayers. These results confirm that ALD produces a uniform tunnel barrier with sub-nanometer thickness control.

TABLE 1

Estimated critical current density ($J_C$) and tunnel specific resistance ($R_NA$) of ALD JJs

| Tunnel Barrier | Minimum Barrier Thickness (Å) | Estimated $J_C$ (A/$cm^2$) | $R_NA$ (μm Ω) |
|---|---|---|---|
| 5 cycles ALD $Al_2O_3$ | 6 | 696 ± 150 | 375 ± 66 |
| 8 cycles ALD $Al_2O_3$ | 9.6 | 371 ± 113 | 650 ± 150 |
| 10 cycles ALD $Al_2O_3$ | 1.2 | 38 ± 3.4 | 6750 ± 571 |
| 13 cycles ALD $Al_2O_3$ | 15.6 | 32 ± 2.7 | 11000 ± 1169 |

Figure 16:
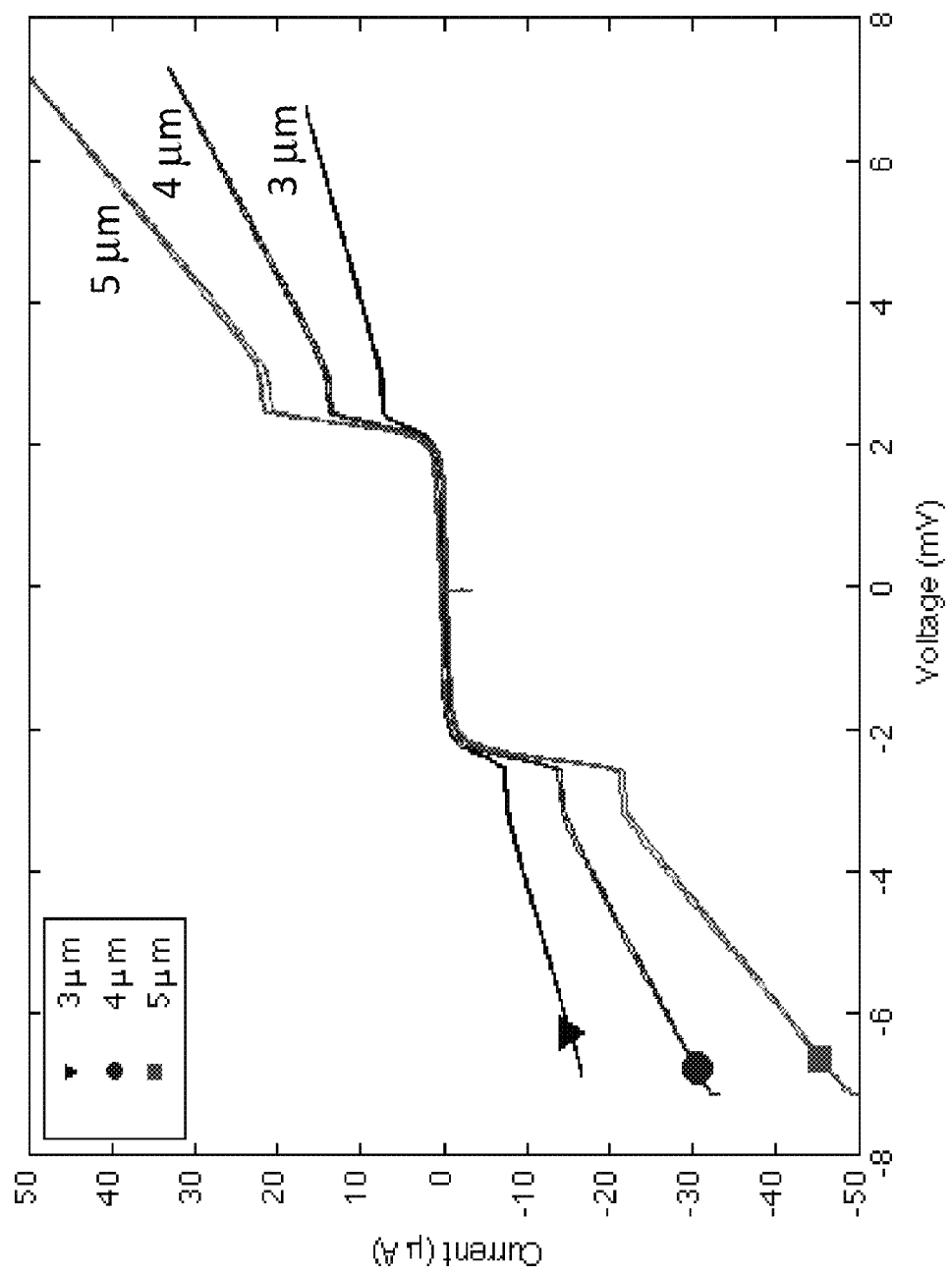
FIG. 16 shows a low temperature (4.2 K) current-voltage curve for three Josephson junctions with tunnel barriers fabricated by 8 cycles of atomic layer deposition (trilayer A).

While room temperature characterizations of microstructure and resistivity provide important information about the quality of the ultrathin $Al_2O_3$ tunnel barrier grown by ALD, and the results indicate strongly the formation of a uniform, low-leakage tunneling barrier, a low temperature (below critical temperature of the superconducting electrodes) measurement of quasi-particle tunneling characteristics is the ultimate test to determine the integrity of the tunnel barrier. In order to measure the quasi-particle tunneling spectra, SIS tunnel junctions were fabricated from a trilayer with an 8-cycle ALD barrier layer on a 7 nm Al wetting layer (trilayer A) and the 0-cycle reference sample (trilayer B) which only went through the heating and cooling steps of ALD and also had a 7 nm Al wetting layer. Square junctions with nominal dimensions ranging from 3×3 μ$m^2$ to 5×5 μ$m^2$ were made and tested using a low noise SIS tunnel junction measurement system at 4.2 K. FIG. 16 shows the IVC of three Nb/Al/ALD-$Al_2O_3$/Nb junctions with varying dimensions. The low subgap leakage current and uniform specific tunnel resistance $R_NA$=3.57 kΩ·μ$m^2$ at voltages greater than 2Δ/e, where Δ and e are the superconducting gap energy of Nb and the charge on an electron, verify that eight cycles of ALD $Al_2O_3$ formed a uniform, low-leakage tunnel barrier. Despite the low subgap leakage current and the uniform specific tunnel resistance of both trilayers, the expected supercurrent at zero voltage due to the Josephson effect was entirely suppressed on trilayer A and heavily suppressed on trilayer B. The magnitude of this supercurrent, $I_c$, is expected to be ~75% of the gap current, $I_g$, defined as the current at the gap voltage of 2Δ/e. For trilayer B, $I_c$ is only ~30% $I_g$; for trilayer A, $I_c$ is nonexistent. The tunnel barrier for trilayer A terminates in a hydroxylated surface due to the chemistry of ALD, and residual water in the ALD chamber almost certainly hydroxylated trilayer B during the heating process. It is speculated that these hydroxyl groups act as charged scattering centers for Cooper pairs, and this is the source of the apparent pair breaking mechanism across these tunnel junctions.

An embodiment of the present apparatus was used to produce a ~1 nm leak-free tunnel barrier on metallic electrodes with a pristine interface. Using this apparatus, the suitability of using Al as a wetting layer in SIS Nb—Al/$Al_2O_3$/Nb JJs was investigated and it was found that while a thermally oxidized interfacial layer may form, it can be minimized by reducing the Al wetting thickness to 0.15 nm for ~1 nm thick $Al_2O_3$ tunnel barrier. Further, SIS Nb—Al/$Al_2O_3$/Nb JJs were fabricated and characterized. It was shown that uniform, leak-free tunnel barriers and the critical current density and specific tunnel resistance can be controlled by altering the thickness of the ALD tunnel barrier in the range of 0.6 nm to 1.6 nm. This example demonstrates the viability of the present apparatus for the fabrication of tunneling devices comprising metal-dielectric-metal trilayers and multilayers.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An apparatus for in situ fabrication of multilayer heterostructures comprising:
   (a) a first vacuum chamber adapted for atomic layer deposition and comprising a first stage docking assembly configured to dock a detachable stage configured to support a substrate;
   (b) a second vacuum chamber adapted for ultra-high vacuum physical vapor deposition or ultra-high vacuum chemical vapor deposition and comprising a second stage docking assembly configured to dock the detachable stage;
   (c) a load lock vacuum chamber between the first and second vacuum chambers and comprising a third stage docking assembly configured to dock the detachable stage, the load lock vacuum chamber coupled to the first vacuum chamber via a first shared valve and coupled to the second vacuum chamber via a second shared valve; and
   (d) a substrate transport vacuum chamber comprising a substrate transfer device, the substrate transfer device configured to detachably couple to the detachable stage and to transfer the substrate supported by the detachable stage in situ between the first vacuum chamber, the second vacuum chamber and the load lock vacuum chamber,
   wherein the first vacuum chamber, the second vacuum chamber, the load lock vacuum chamber and the substrate transport vacuum chamber are arranged collinearly defining a longitudinal axis of the apparatus running substantially through the center of each vacuum chamber,
   further wherein the substrate transfer device is further configured to rotate about the longitudinal axis of the apparatus to rotate the detachable stage into a fixed, face-down orientation in at least one of the first, second, and load lock vacuum chambers and to rotate in situ the detachable stage into a fixed, face-up orientation in at least one other of the first, second, and load lock vacuum chambers,
   further wherein the first stage docking assembly comprises a first chuck comprising a pair of parallel rails oriented substantially parallel to the longitudinal axis of the apparatus, each rail defining a slot running along the longitudinal axis of the rail, each slot configured to mate with a protrusion of a docking coupler mounted to a substrate platform of the detachable stage positioned in the face-down orientation, each slot further configured to allow the detachable stage to pass through the first chuck during translation of the detachable stage in a direction parallel to the longitudinal axis of the apparatus,
   and further wherein the second stage docking assembly comprises a second chuck comprising a second slot configured to mate with a second protrusion of the docking coupler and the third stage docking assembly comprises a third chuck comprising a third slot configured to mate with a third protrusion of the docking coupler.

2. The apparatus of claim 1, wherein the substrate transport vacuum chamber is coupled to the first vacuum chamber via a third shared valve.

3. The apparatus of claim 1, wherein the first vacuum chamber is blackbody heated so that the chamber walls of the first vacuum chamber are heated such that the chamber walls emit sufficient energy to heat the interior of the first vacuum chamber to a temperature sufficient to carry out atomic layer deposition.

4. The apparatus of claim 1, wherein the first stage docking assembly comprises an inset comprising a body defining an interior and oppositely facing openings at opposing ends of the body, through which openings the detachable stage passes during translation in a direction parallel to the longitudinal axis of the apparatus, the inset further comprising the first chuck mounted to the body and positioned within the interior.

5. The apparatus of claim 1, wherein the third stage docking assembly comprises a frame configured to house the third chuck mounted to the frame.

6. The apparatus of claim 1, wherein the load lock vacuum chamber is adapted for at least one in situ treatment operation or at least one in situ characterization technique, or both, for a deposited layer of the multilayer heterostructure.

7. The apparatus of claim 1, further comprising the detachable stage comprising the substrate platform and the docking coupler mounted to the substrate platform.

8. The apparatus of claim 1, wherein the substrate transfer device is a linear transport rod.

9. The apparatus of claim 1, wherein the second docking assembly is configured to receive the detachable stage in the face-down orientation and the third stage docking assembly is configured to receive the detachable stage in the face-up orientation.

10. The apparatus of claim 1, wherein the second vacuum chamber is adapted for ultra-high vacuum physical vapor deposition.

11. A method for in situ fabrication of multilayer heterostructures comprising:
   (a) placing the substrate supported by the detachable stage into the load lock vacuum chamber of the apparatus of claim 1;
   (b) moving the detachable stage via the substrate transfer device from the third stage docking assembly in the load lock vacuum chamber to the second stage docking assembly in the second vacuum chamber in situ;
   (c) depositing a first layer of a first material onto the substrate using ultra-high vacuum physical vapor deposition;
   (d) moving the detachable stage via the substrate transfer device to the first stage docking assembly in the first vacuum chamber in situ; and
   (e) depositing a layer of a second material onto the first layer of the first material via atomic layer deposition, thereby fabricating the multilayer heterostructure.

12. The method of claim 11, further comprising:
(f) moving the detachable stage via the substrate transfer device to the second stage docking assembly in the second vacuum chamber in situ; and
(g) depositing a second layer of the first material on the layer of the second material, wherein the multilayer heterostructure is a metal-insulator-metal heterostructure.

* * * * *